(12) United States Patent
Yamashita et al.

(10) Patent No.: US 8,810,554 B2
(45) Date of Patent: *Aug. 19, 2014

(54) DISPLAY DEVICE AND ELECTRONIC PRODUCT

(75) Inventors: Junichi Yamashita, Tokyo (JP); Katsuhide Uchino, Kanagawa (JP)

(73) Assignee: Sony Corporation, Tokyo (JP)

( * ) Notice: Subject to any disclaimer, the term of this patent is extended or adjusted under 35 U.S.C. 154(b) by 876 days.

This patent is subject to a terminal disclaimer.

(21) Appl. No.: 12/588,384

(22) Filed: Oct. 14, 2009

(65) Prior Publication Data

US 2010/0118002 A1     May 13, 2010

(30) Foreign Application Priority Data

Nov. 7, 2008  (JP) ................................. 2008-286780

(51) Int. Cl.
  *G06F 3/038*    (2013.01)
  *G09G 5/00*     (2006.01)
  *G09G 3/30*     (2006.01)

(52) U.S. Cl.
  USPC .............................. 345/207; 345/77; 345/205

(58) Field of Classification Search
  USPC ........................................................ 345/207
  See application file for complete search history.

(56) References Cited

U.S. PATENT DOCUMENTS

| 2003/0227262 A1 | 12/2003 | Kwon |
| 2004/0046164 A1 | 3/2004 | Kobayashi et al. |
| 2004/0070557 A1 | 4/2004 | Asano et al. |
| 2005/0206590 A1 | 9/2005 | Sasaki et al. |
| 2006/0049781 A1* | 3/2006 | Lee et al. ....................... 315/312 |
| 2006/0088275 A1* | 4/2006 | O'Dea et al. ..................... 386/46 |
| 2006/0125773 A1* | 6/2006 | Ichikawa et al. .............. 345/102 |
| 2006/0170628 A1 | 8/2006 | Yamashita et al. |
| 2008/0198103 A1* | 8/2008 | Toyomura et al. .............. 345/77 |
| 2008/0252568 A1* | 10/2008 | Kwon .............................. 345/76 |

FOREIGN PATENT DOCUMENTS

| JP | 2003-255856 | 9/2003 |
| JP | 2003-271095 | 9/2003 |
| JP | 2004-029791 | 1/2004 |
| JP | 2004-093682 | 3/2004 |
| JP | 2004-133240 | 4/2004 |
| JP | 2006-215213 | 8/2006 |

* cited by examiner

*Primary Examiner* — Charles V Hicks
(74) *Attorney, Agent, or Firm* — Rader, Fishman & Grauer PLLC

(57) ABSTRACT

A display device includes: a screen unit; a drive unit; and a signal processing unit, and wherein the screen unit includes rows of scanning lines, columns of signal lines, matrix-state pixel circuits and a light sensor, the drive unit includes a scanner supplying a control signal to the scanning lines and a driver supplying a video signal to the signal lines, the screen unit is sectioned into plural regions each having plural pixel circuits, the drive unit allows plural pixel circuits belonging to different regions to simultaneously emit light, the pixel circuit emits light in accordance with the video signal, the light sensor outputs a luminance signal in accordance with the light emission and the signal processing unit corrects the video signal in accordance with the luminance signal and supplies the signal to the driver.

10 Claims, 23 Drawing Sheets

FIG.9
(X)
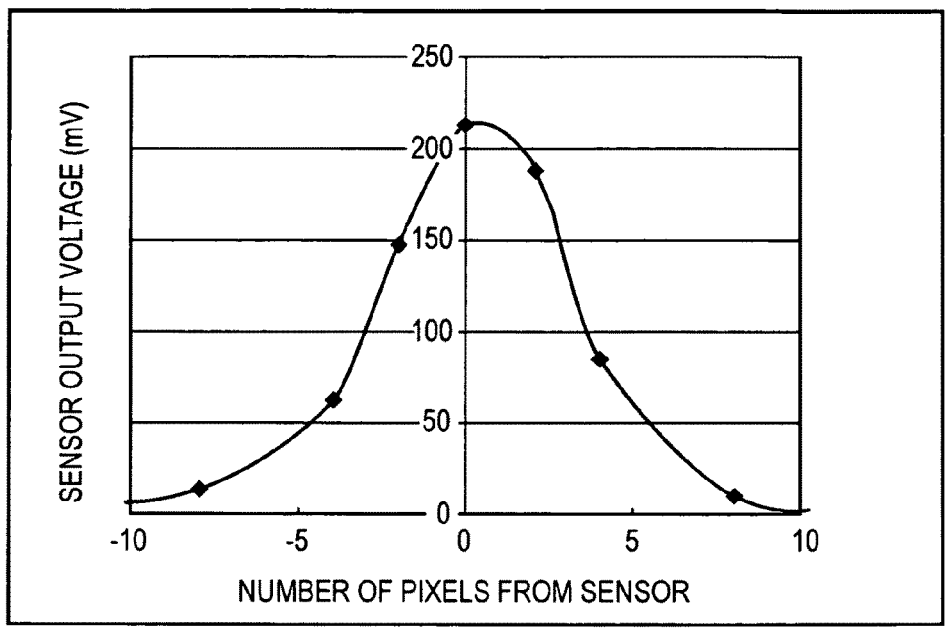
LUMINANCE SIGNAL IN ROW DIRECTION
(Y)
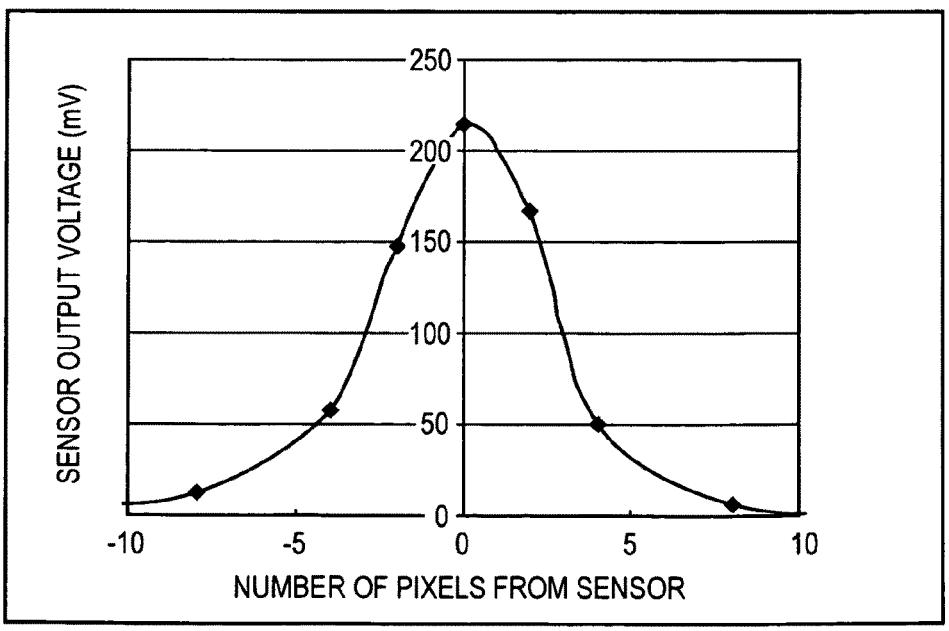
LUMINANCE SIGNAL IN COLUMN DIRECTION

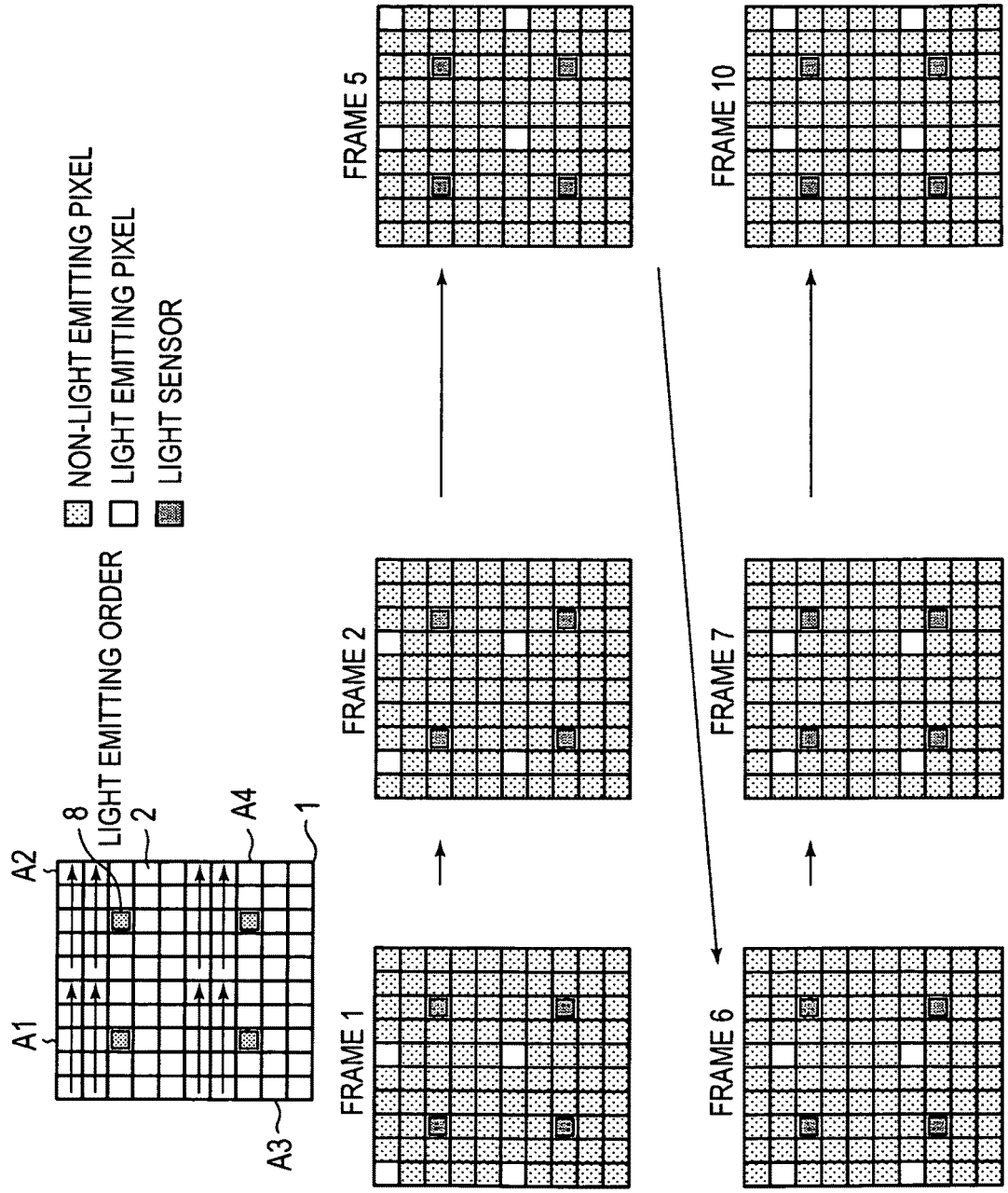

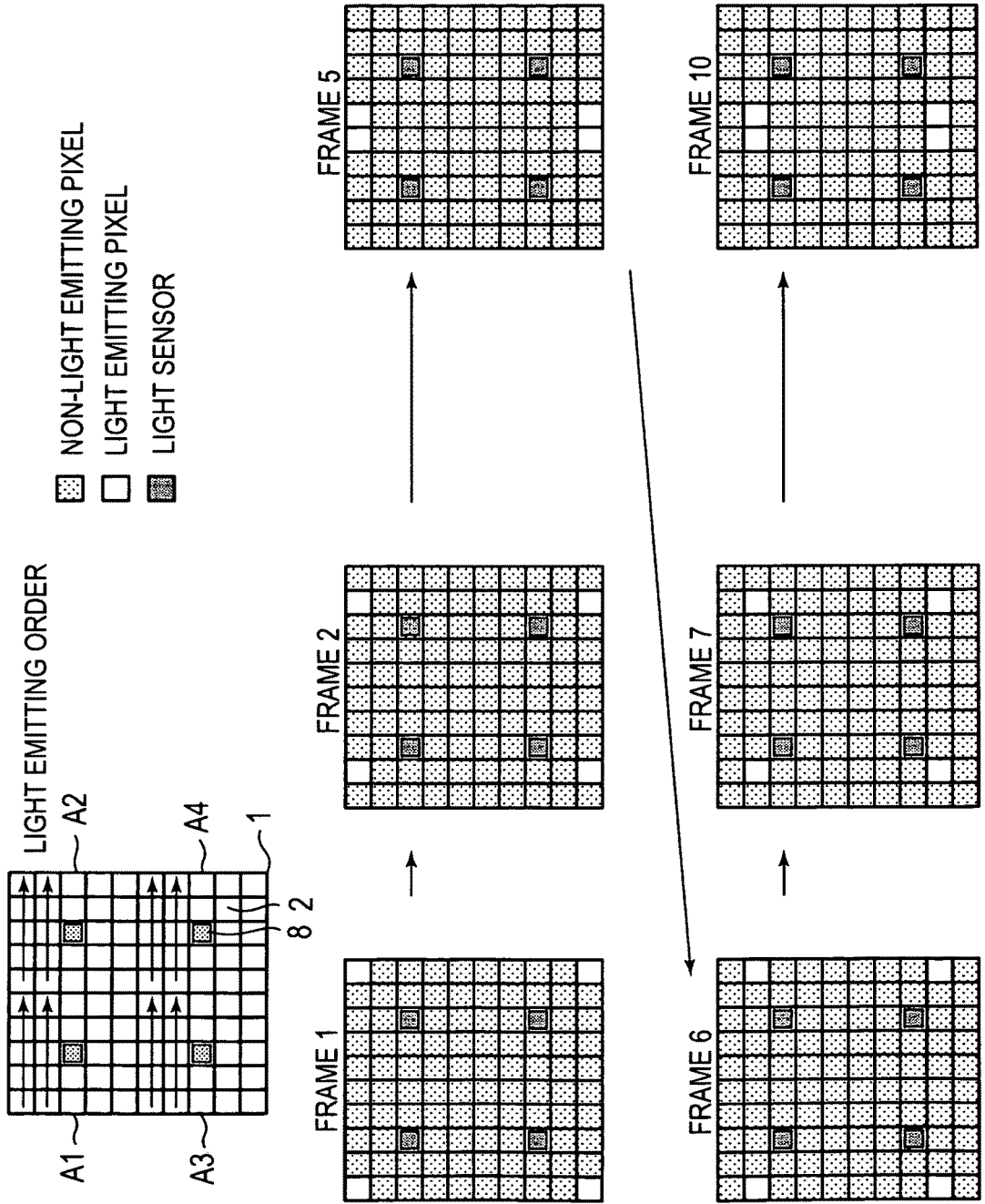

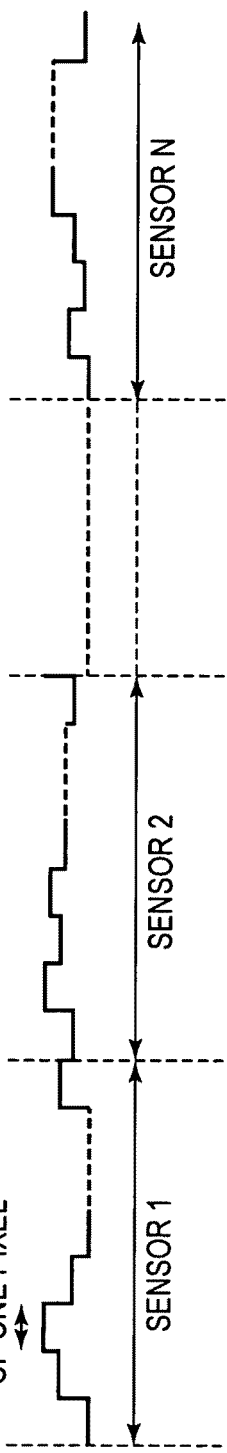
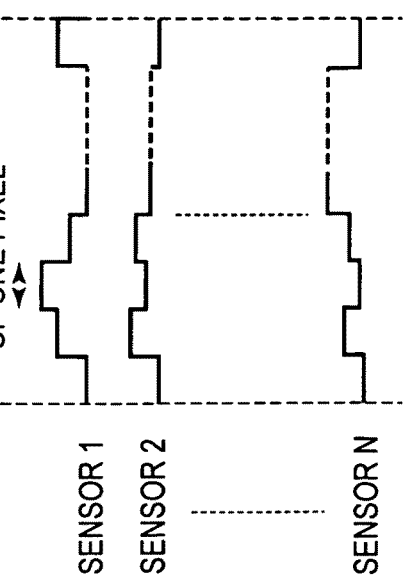
FIG.10C

FIG.11
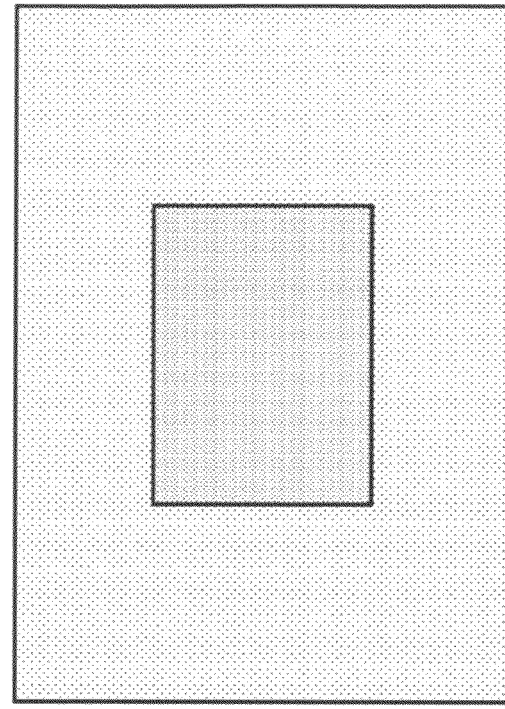
(A1) PATTERN DISPLAY AS CAUSE OF BURN-IN
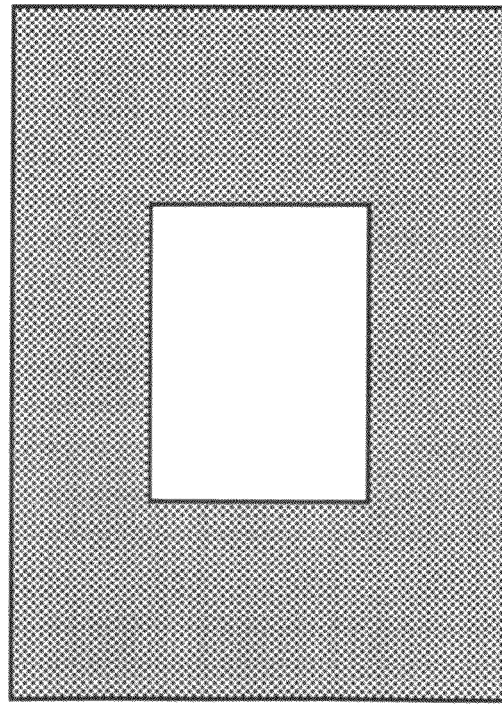
(A2) RASTER DISPLAY AFTER BURN-IN

DISPLAY DEVICE AND ELECTRONIC PRODUCT

BACKGROUND OF THE INVENTION

1. Field of the Invention

The present invention relates to a display device displaying images by current-driving a light emitting element arranged at each pixel. The invention also relates to an electronic product using the display device. Particularly, the invention relates to a drive system of a so-called active matrix display device, which controls a current amount flowing in the light emitting element such as an organic EL element by an insulated-gate field effect transistor provided in each pixel circuit or the like.

2. Description of the Related Art

In display devices, for example, in a liquid crystal display, a large number of pixels are arranged in a matrix state and images are displayed by controlling transmission intensity or reflection intensity of incident light in each pixel in accordance with image information to be displayed. This is the same as in an organic EL display in which organic EL elements are used for pixels, however, the organic EL element is a self-luminous element which is different from a liquid crystal pixel. Accordingly, the organic EL display has advantages, for example, visibility of images is higher, a backlight is not necessary and response speed is higher as compared with the liquid crystal display. Additionally, the luminance level (gray scale) of each light emitting element can be controlled by a current value flowing in each element, and the organic EL display is largely different from the liquid crystal display which belongs to a voltage control type in a point that it belongs to a so-called current control type.

The organic EL display has a passive matrix type and an active matrix type as a drive system thereof in the same manner as the liquid crystal display. The former has problems such that it is difficult to realize a large-sized as well as high-definition display though the structure is simple, and therefore, the active matrix type is extensively developed at present. In this type, electric current flowing in the light emitting element in each pixel circuit is controlled by an active element (commonly, a thin-film transistor, TFT) provided in the pixel circuit, which is written in the following Patent Documents.

[Patent Document 1] JP-A-2003-255856
[Patent Document 2] JP-A-2003-271095
[Patent Document 3] JP-A-2004-133240
[Patent Document 4] JP-A-2004-029791
[Patent Document 5] JP-A-2004-093682
[Patent Document 5] JP-A-2006-215213

SUMMARY OF THE INVENTION

The display device in related art basically includes a screen unit and a drive unit. The screen unit has rows of scanning lines, columns of signal lines and matrix-state pixels arranged at portions where respective scanning lines and respective signal lines intersect. The drive unit is arranged on the periphery of the screen unit, including a scanner sequentially supplying a control signal to respective scanning lines and a driver supplying a video signal to respective signal lines. Each pixel in the screen unit takes a video signal from a corresponding signal line when selected in accordance with the control signal supplied from a corresponding scanning line as well as emits light in accordance with the taken video signal.

Each pixel includes, for example, an organic EL device as a light emitting element. In the light emitting element, current/luminance characteristics tend to deteriorate with time. Accordingly, there is a problem that luminance of each pixel in the organic EL display is reduced with lapse of time. The degree of luminance reduction depends on cumulative light emitting time of each pixel. When the cumulative light emitting time differs in respective pixels in the screen, luminance nonuniformity may occur and an image quality failure called "burn-in" is liable to occur.

In view of the above, it is desirable to provide a display device which is capable of compensating luminance reduction in pixels.

According to an embodiment of the invention, there is provided a display device including a screen unit, a drive unit and a signal processing unit. The screen unit includes rows of scanning lines, columns of signal lines, matrix-state pixel circuits and a light sensor. The drive unit includes a scanner supplying a control signal to the scanning lines and a driver supplying a video signal to the signal lines. The screen unit is sectioned into plural regions each having plural pixel circuits. The drive unit allows plural pixel circuits belonging to different regions to simultaneously emit light. The pixel circuit emits light in accordance with the video signal. The light sensor outputs a luminance signal in accordance with the light emission. The signal processing unit corrects the video signal in accordance with the luminance signal and supplies the signal to the driver.

It is preferable that the screen unit arranges plural light sensors so as to correspond to plural regions, and each light sensor outputs luminance signals in accordance with light emission of pixel circuits belonging to a corresponding region. The signal processing unit supplies a video signal for display during a display period in which video is displayed in the screen unit, and supplies a video signal for detection during a detection period in which video is not displayed in the screen unit. The signal processing unit supplies the video signal for detection in each frame, and allows only pixel circuits of detection targets to emit light. The signal processing unit compares a first luminance signal outputted from the light sensor during a first period with a second luminance signal outputted from the light sensor during a second period after the first period, corrects the video signal in accordance with the comparison result and supplies the signal to the driver.

According to the embodiment of the invention, the signal processing unit corrects the video signal in accordance with the luminance signal outputted from the light sensor as well as supplies the corrected video signal to the driver of the drive unit. According to the configuration, it is possible to compensate luminance deterioration of pixels by the correction of the video signal, and as a result, image quality failures such as "burn-in" which have been problems from the past can be prevented.

According to the embodiment of the invention, the light sensor detects light emitting luminance of each pixel and outputs a corresponding luminance signal. Since the light emitting luminance is detected with respect to each individual pixel, partial luminance nonuniformity can be corrected by correcting the video signal in each pixel even when partial nonuniformity occurs in the screen.

Particularly in the embodiment of the invention, the screen unit is sectioned into plural regions in a range in which these regions do not interfere with one another. The drive unit detects light emitting luminances of plural pixels at the same time by allowing pixels belonging to different regions to emit light at the same time. Accordingly, light emitting luminances of plural pixels are detected at the same time in the embodiment of the invention, and therefore, the total detection time can be shortened as compared with a case in which light emitting luminances are detected by allowing numerous pixels to be lit one-by-one.

In a preferred embodiment of the invention, plural light sensors are arranged in the screen unit so as to correspond to plural regions. Each light sensor detects light emitting luminances of pixels belonging to a corresponding region. Accordingly, one light sensor for correcting the video signal is used with respect to plural pixels included in one region in the embodiment of the invention. At the time of detecting light emitting luminance, plural pixels over plural regions are allowed to emit light simultaneously, for example, pixel-by-pixel with respective to one light sensor. The plural light sensors receive emitted lights of corresponding regions in a dot-sequential manner, detecting light emitting luminances at the same time. According to this, the number of light sensors can be drastically reduced as compared with a case in which pixels and light sensors are arranged one-to-one. Additionally, the detection time of light emitting luminance can be drastically reduced, which realizes cost reduction as well as shortening of operation time for the video signal correction system.

However, the invention is not limited to the above preferred embodiment. It is also preferable that one light sensor is arranged common to plural regions instead of arranging plural light sensors so as to correspond to the sectioned plural regions. Also in this case, the plural regions are sectioned in a range in which these regions do not interfere with one another, therefore, if two pixels emit light simultaneously at adjacent regions, these pixels are sufficiently apart to a degree that lights emitted from these pixels do not interfere with each other. Accordingly, light sensors arranged common to adjacent regions can detect lights emitted from pixels at respective regions in a state that lights are not mixed together. However, when the light sensor is arranged common to plural regions, it is necessary to devise a method in which the light receiving operation is performed in a time division manner. For example, the light emitting operation in the pixel side is performed simultaneously at plural regions, while the light receiving operation in the common light sensor side may be performed in the time division manner.

BRIEF DESCRIPTION OF THE DRAWINGS

FIG. 9 shows graphs representing distributions of light-receiving sensitivity of the light sensor;

FIG. 10A is a schematic diagram for explaining operations of the first embodiment;

FIG. 10B is also a schematic diagram for explaining operations;

FIG. 10C shows timing charts for explaining operations;

FIG. 11 is a schematic diagram showing a burn-in phenomenon;

DESCRIPTION OF THE PREFERRED EMBODIMENTS

Hereinafter, the preferred embodiments (referred to as embodiments in the following description) will be explained. The explanation will be made in the following order.
First Embodiment
Second Embodiment
Third Embodiment
Fourth Embodiment
Application Example
First Embodiment
[Whole Configuration of a Panel]

Figure 1:
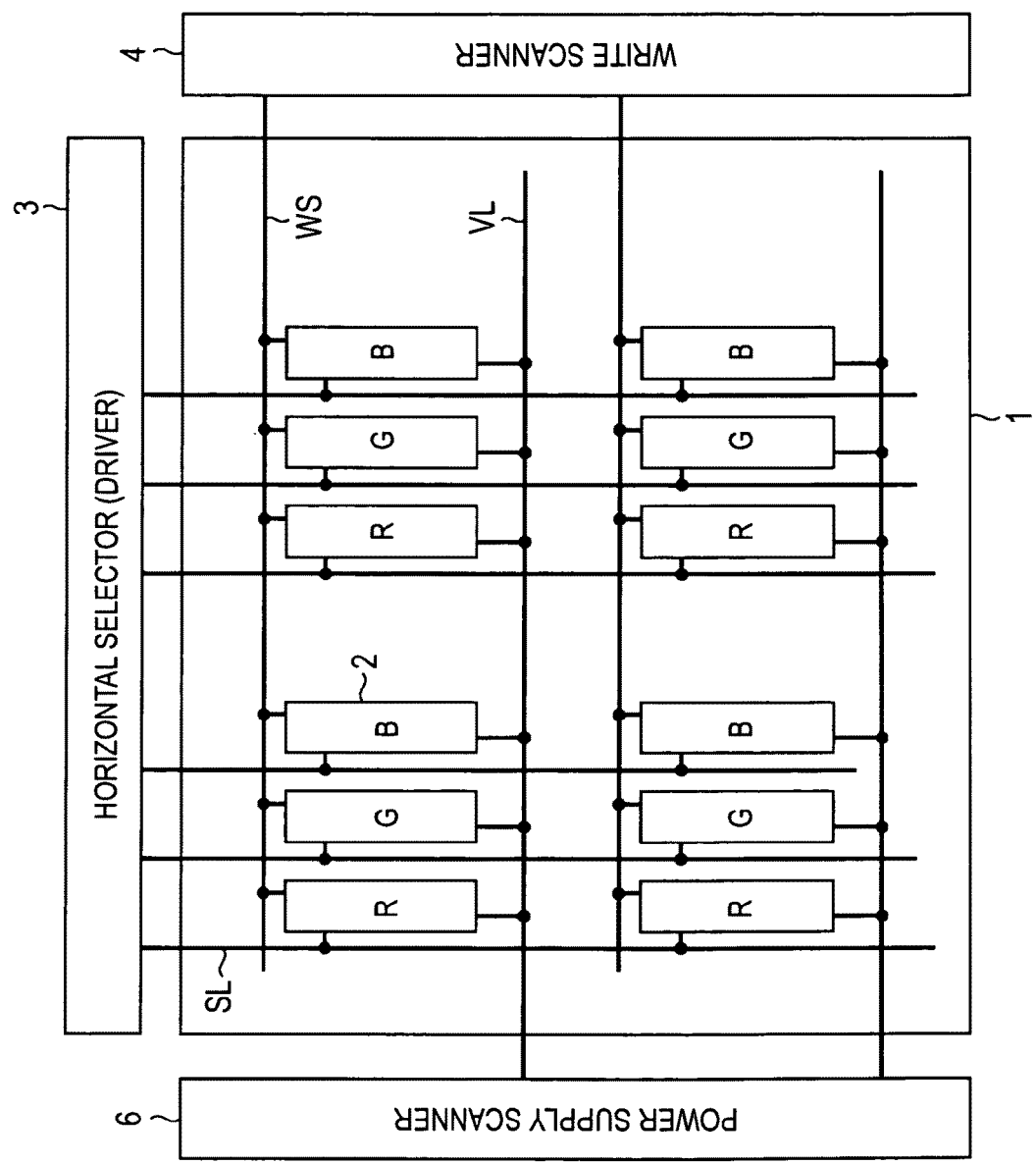
FIG. 1 is a block diagram of a panel of a display device according to a first embodiment of the invention.

FIG. 1 is the whole configuration diagram showing a panel which is a main unit of a display device according to an embodiment of the invention. As shown in the drawing, the display device includes a pixel array unit 1 (screen unit) and a drive unit which drives the pixel array unit 1. The pixel array unit 1 has rows of scanning lines WS, columns of signal lines SL, matrix-state pixels 2 arranged at portions where the both lines intersect and feeding lines (power lines) VL arranged so as to correspond to respective lines of respective pixels 2. In the example, any of RGB three primary colors is assigned to each pixel 2 to realize color display. However, the invention is not limited to this and also includes a single-color display device. The drive unit includes a write scanner 4 performing line-sequential scanning of the pixels 2 row by row by sequentially supplying a control signal to respective scanning lines WS, a power supply scanner 6 supplying a power supply voltage which switches between a first voltage and a second voltage to respective feeding lines VL so as to correspond to the line-sequential scanning and a horizontal selector (signal driver) 3 supplying a signal potential and a reference potential to be a video signal to rows of signal lines SL so as to correspond to the line-sequential scanning.

[Circuit Configuration of a Pixel]

Figure 2:
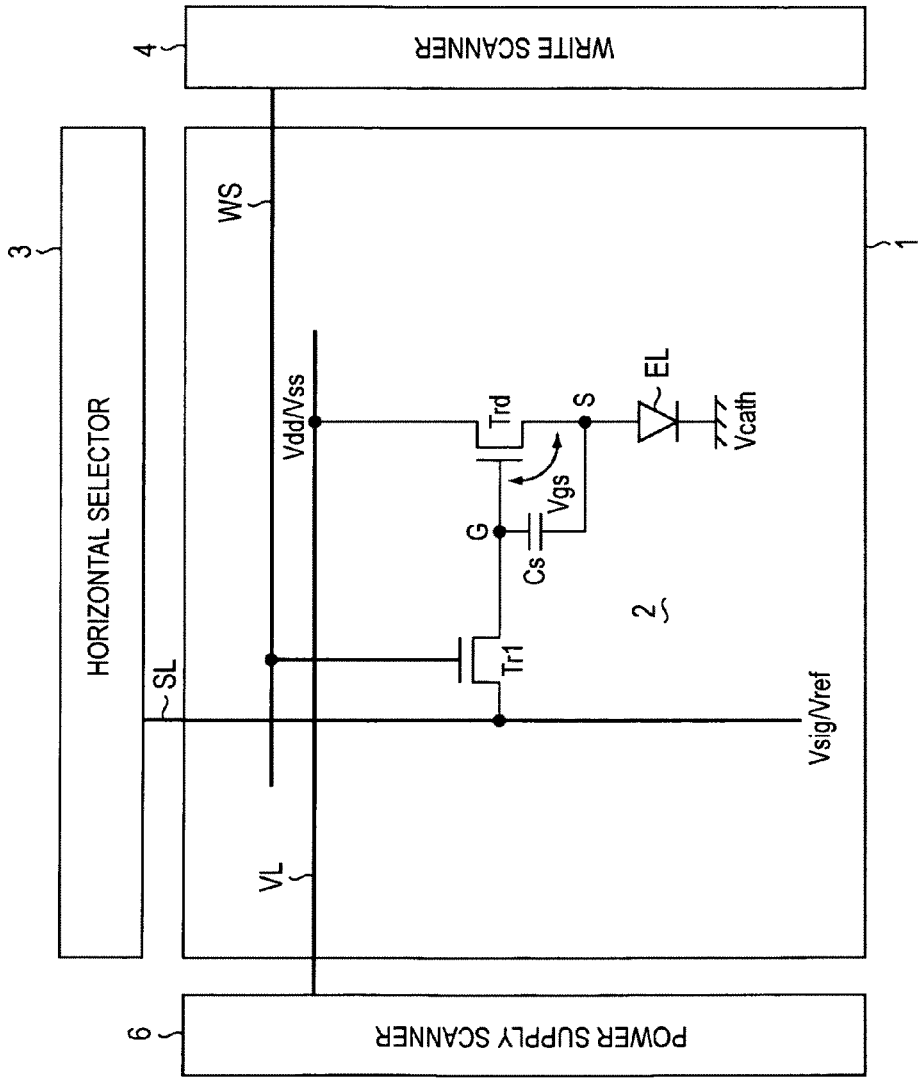
FIG. 2 is a pixel circuit diagram according to the first embodiment.

FIG. 2 is a circuit diagram showing specific configuration and connection relation of the pixel 2 included in the display device shown in FIG. 1. As shown in the drawing, the pixel 2 includes a light emitting element EL which is typified by an organic EL device and the like, a sampling transistor Tr1, a drive transistor Trd and a pixel capacitor Cs. The sampling transistor Tr1 is connected to a corresponding scanning line WS at a control end (gate) thereof, connected to a corresponding signal line SL at one of a pair of current ends (source/drain) and connected to a control end (gate G) of the drive transistor Trs at the other of the current ends. The drive transistor Trd is connected to the light emitting element EL at one of a pair of current ends (source/drain) and connected to a corresponding feeding line VL at the other of the current ends. In the example, the drive transistor Trd is an N-channel type, in which the drain thereof is connected to the feeding line VL and the source S is connected to an anode of the light emitting element EL as an output node. A cathode of the light emitting element EL is connected to a given cathode potential Vcath. The pixel capacitor Cs is connected between the source S as one of the current ends of the drive transistor Trd and the gate G which is the control end.

In the above configuration, the sampling transistor Tr1 becomes conductive in accordance with a control signal supplied from the scanning line WS, performing sampling of a signal potential supplied from the signal line SL to store the potential in the pixel capacitor Cs. The drive transistor Trd receives current supply from the feeding line VL in a first potential (high potential Vdd), allowing drive current to flow into the light emitting element EL in accordance with the signal potential stored in the pixel capacitor Cs. The write scanner 4 outputs a control signal having a given pulse width to the control line WS for allowing the sampling transistor Tr1 to be conductive in a time slot in which the signal line SL is in the signal potential, and thereby storing the signal potential in the pixel capacitor Cs as well as adding correction with respect to a mobility μ of the drive transistor Trd to the signal potential. After that, the drive transistor Trd supplies drive current corresponding to the signal potential Vsig which is to be written in the pixel capacitor Cs to the light emitting element EL, proceeding to a light emitting operation.

The pixel circuit 2 also includes a threshold voltage correction function in addition to the mobility correction function described above. Specifically, the power supply scanner 6 switches the feeding line VL from the first potential (high potential Vdd) to a second potential (low potential Vss) at a first timing before the sampling transistor Tr1 samples the signal potential Vsig. The write scanner 4 allows the sampling transistor Tr1 to be conductive at a second timing to apply a reference potential Vref from the signal line SL to the gate G of the drive transistor Trd as well as set the source S of the drive transistor Trd to the second potential (Vss) also before the sampling transistor Tr1 samples the signal potential Vsig. The power supply scanner 6 switches the feeding line VL from the second potential Vss to the first potential Vdd at a third timing after the second timing to store a voltage corresponding to a threshold voltage Vth of the drive transistor Trd in the pixel capacitor Cs. According to the above threshold voltage correction function, the display device can cancel effects of the threshold voltage Vth of the drive transistor Trd which varies according to the pixel.

The pixel circuit 2 also includes a bootstrap function. That is, the write scanner 4 releases the application of the control signal to the scanning line WS in a stage when the signal potential Vsig is stored in the pixel capacitor Cs to allow the sampling transistor Tr1 to be a non-conductive state and to electrically cut off the gate G of the drive transistor Trd from the signal line SL, thereby allowing the potential of the gate G to change with a potential change of the source S of the drive transistor Trd and maintaining a voltage Vgs between the gate G and the source S to be constant.

[Timing Chart 1]

Figure 3:
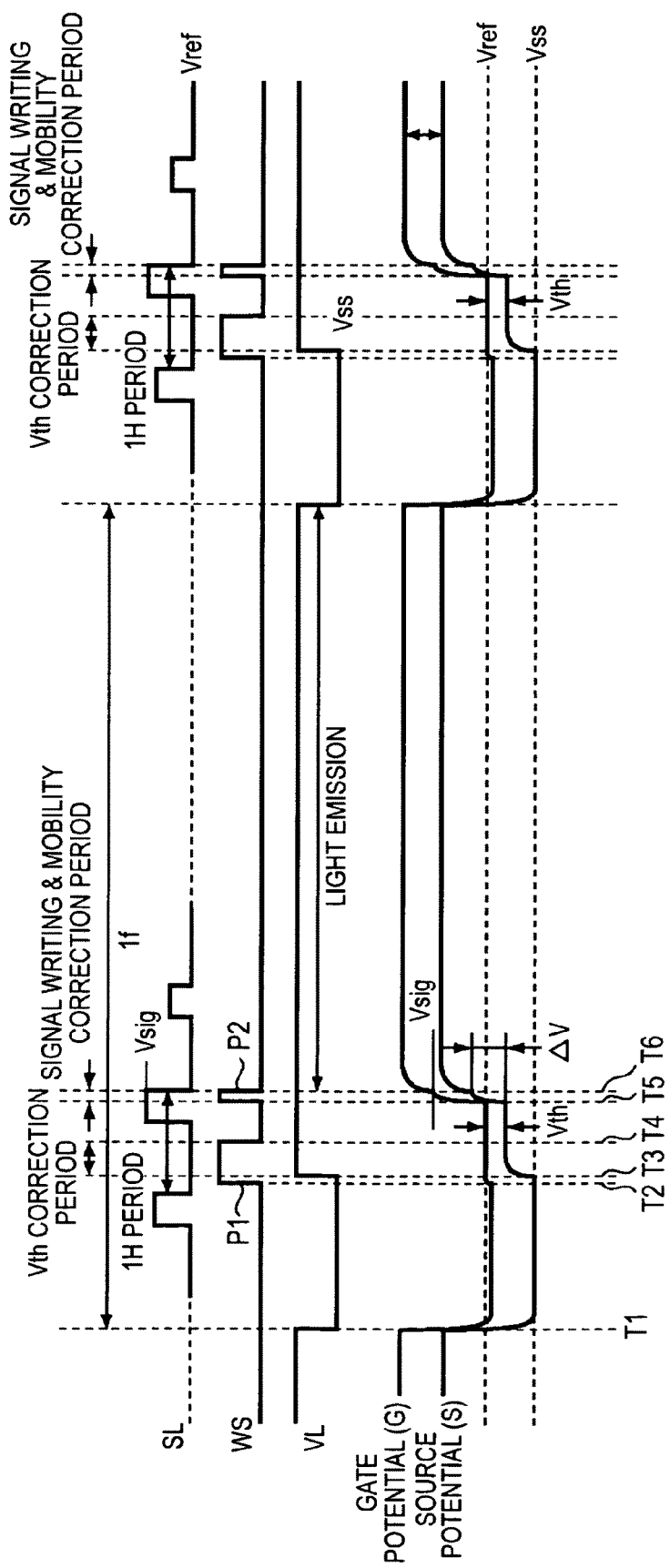
FIG. 3 is a timing chart for explaining operations of the first embodiment.

FIG. 3 is a timing chart for explaining operations of the pixel circuit 2 shown in FIG. 2. In the drawing, a potential change of the scanning line WS, a potential change of the feeding line VL and a potential change of the signal line SL are represented in a time axis common to these lines. Additionally, potential changes of the gate G and the source S of the drive transistor are also represented in parallel to these potential changes.

A control signal pulse for turning on the sampling transistor Tr1 is applied to the scanning line WS. The control signal pulse is applied to the scanning line WS in one frame (1f) period so as to correspond to ling-sequential scanning of the pixel array unit. The control signal pulse includes two pulses during one horizontal scanning period (1H). The first pulse is sometimes referred to as a first pulse P1 and the succeeding pulse is referred to as a second pulse P2. The feeding line VL switches between the high potential Vdd and the low potential Vss also during one frame period (1f). A video signal switching between the signal potential Vsig and the reference signal Vref during one horizontal scanning period (1H) is supplied to the signal line SL.

As shown in the timing chart of FIG. 3, the pixel enters a non-light emitting period in the present frame from a light emitting period in the previous frame, then, proceeding to the light emitting period in the present frame. In the non-light emitting period, a preparation operation, a threshold voltage correction operation, a signal writing operation, a mobility correction operations and the like are performed.

In the light emitting period of the previous frame, the feeding line VL is in the high potential Vdd, and the drive transistor Trd supplies a drive current Ids to the light emitting element EL. The drive current Ids passes the light emitting element EL from the feeding line VL in the high potential Vdd through the drive transistor Trd, flowing into the cathode line.

Subsequently, in the non-emitting period of the present frame, the feeding line VL is switched from the high potential Vdd to the low potential Vss at a timing T1. According to this, the feeding line VL is discharged to be Vss, and further, the source S of the drive transistor Trd is reduced to Vss. Accordingly, an anode potential of the light emitting element EL (that is, the source potential of the drive transistor Trd) is in a reverse bias state, therefore, the drive current does not flow and light is turned off. The potential of the gate G is also reduced with the potential reduction of the source S of the drive transistor Trd.

Next, at a timing T2, the sampling transistor Tr1 becomes conductive by switching the scanning line WS from the low level to the high level. At this time, the signal line SL is in the reference potential Vref. Therefore, the potential of the gate G of the drive transistor Trd is in the reference potential Vref of the signal line SL through the conductive sampling transistor Tr1. At this time, the source S of the drive transistor Trd is in the potential Vss which is sufficiently lower than Vref. In the above manner, the voltage Vgs between the gate G and the source S of the drive transistor Trd is initialized so that it becomes larger than the threshold voltage Vth of the drive transistor Trd. A period T1-T3 from the timing T1 to a timing T3 corresponds to a preparation period in which the voltage Vgs between the gate G and the source S of the drive transistor Trd is set to Vth or more in advance.

After that, in the timing T3, the feeding line VL makes a transition from the low potential Vss to the high potential Vdd, and the potential of the source S of the drive transistor Trd starts increasing. Then, the current is cut off when the voltage Vgs between the gate G and the source S of the drive transistor Trd becomes the threshold voltage Vth. In this manner, the voltage corresponding to the threshold voltage Vth of the drive transistor Trd is written in the pixel capacitor Cs. This is the threshold voltage correction operation. At this time, the cathode potential Vcath is set in order that the light emitting element EL is cut off for the purpose of allowing the current to flow in the pixel capacitor Cs side exclusively and not to flow into the light emitting element EL.

At a timing T4, the scanning line WS returns to the low level from the high level. In other words, the first pulse P1 applied to the scanning line WS is released to allow the sampling transistor to be turned off. As apparent from the above explanation, the first pulse P1 is applied to the gate of the sampling transistor Tr1 to perform the threshold voltage correction operation.

After that, the signal line SL switches from the reference potential Vref to the signal potential Vsig. Subsequently, the scanning line WS rises from the low level to the high level again at a timing T5. In other words, the second pulse P2 is applied to the gate of the sampling transistor Tr1. Accordingly, the sampling transistor Tr1 is turned on again and samples the signal potential Vsig from the signal line SL. Therefore, the potential of the gate G of the drive transistor Trd becomes the signal potential Vsig. Here, since the light emitting element EL is in the cut-off state (high-impedance state) first, current flowing between the drain and the source of the drive transistor Trd flows into the pixel capacitor Cs and an equivalent capacitor of the light emitting element EL exclusively to start charging. After that, the potential of the source S of the drive transistor Trd is increased by ΔV until a timing T6 when the sampling transistor Tr1 is turned off. Accordingly, the signal potential Vsig of the video signal is written in the pixel capacitor Cs by being added to Vth as well as the voltage ΔV for mobility correction is subtracted from the voltage stored in the pixel capacitor Cs. Therefore, a period T5-T6 from the timing T5 to the timing T6 corresponds to a signal writing period and a mobility correction period. In other words, when the second pulse P2 is applied to the scanning line WS, the signal writing operation and the mobility correction operation are performed. The signal writing period and the mobility correction period T5-T6 are equal to a pulse width of the second pulse P2. That is, the pulse width of the second pulse P2 prescribes the mobility correction period.

As described above, writing of the signal potential Vsig and the adjustment of the correction amount ΔV are performed at the same time in the signal writing period T5-T6. The higher Vsig is, the higher the current Ids supplied by the drive transistor Trd becomes, and the higher an absolute value of ΔV becomes. Therefore, the mobility correction corresponding to a light emitting luminance level is performed. When Vsig is fixed, the absolute value of ΔV becomes larger as the mobility μ of the drive transistor Trd is higher. In other words, the higher the mobility μ is, the higher a negative feedback amount ΔV to the pixel capacitor Cs becomes, therefore, variation of the mobility μ in each pixel can be cancelled.

Lastly, at a timing T6, the scanning line WS makes a transition to the low-level side as described above and the sampling transistor Tr1 is turned off. Accordingly, the gate G of the drive transistor Trd is cut off from the signal line SL. At this time, the drain current Ids start flowing in the light emitting element EL. Accordingly, the anode potential of the light emitting element EL increases in accordance with the drive current Ids. The increase of the anode potential of the light emitting element EL is precisely the potential increase of the source S of the drive transistor Trd. When the potential of the source S of the drive transistor Trd increases, the potential of the gate G of the drive transistor Trd also increases by the bootstrap operation of the pixel capacitor Cs. An increase amount of the gate potential will be equal to an increase amount of the source potential. Therefore, the input voltage Vgs between the gate G and the source S of the drive transistor Trd is maintained to be constant during the light emitting period. A value of the gate voltage Vgs has received correction of the threshold voltage Vth and the mobility μ to the signal potential Vsig. The drive transistor Trd operates in a saturation region. That is, the drive transistor Trd outputs the drive current Ids corresponding to the input voltage Vgs between the gate G and the source S. The value of the gate voltage Vgs has received correction of the threshold voltage Vth and the mobility μ to the signal potential Vsig.

[Timing Chart 2]

Figure 4:
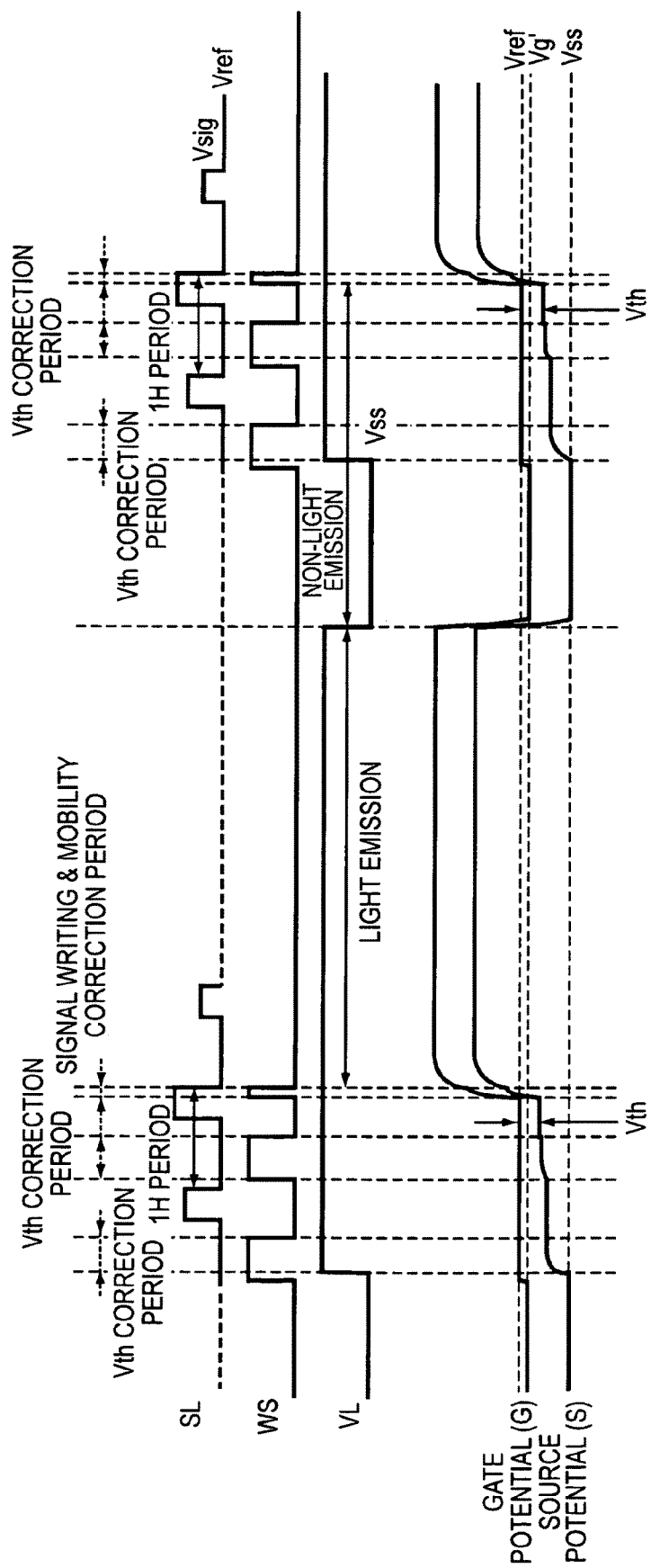
FIG. 4 is also a timing chart for explaining operations.

FIG. 4 is another timing chart for explaining operations of the pixel circuit 2 shown in FIG. 2. The drawing is basically the same as the timing chart shown in FIG. 3, and corresponding reference codes are given to corresponding portions. A different point is that the threshold voltage correction operation is performed repeatedly over plural horizontal periods in a time-division manner. In the example of the timing chart of FIG. 4, the Vth correction operation in each 1H period is performed twice. When the screen unit becomes the high definition one, the number of pixels is increased and the number of scanning lines is also increased. The 1H period becomes shorter by the increase of the number of scanning lines. As the line-sequential scanning is performed at higher speed, there is a case in which the Vth correction operation is not completed in the 1H period. Accordingly, in the timing chart of FIG. 4, the threshold correction operation is performed twice in the time-division manner, so that the potential Vgs between the gate G and the source S of the drive transistor Trd is initialized to Vth reliably. The number of repeating the Vth correction is not limited to twice but the number of time division can be increased if necessary.

[Whole Configuration of the Display Device]

Figure 5:
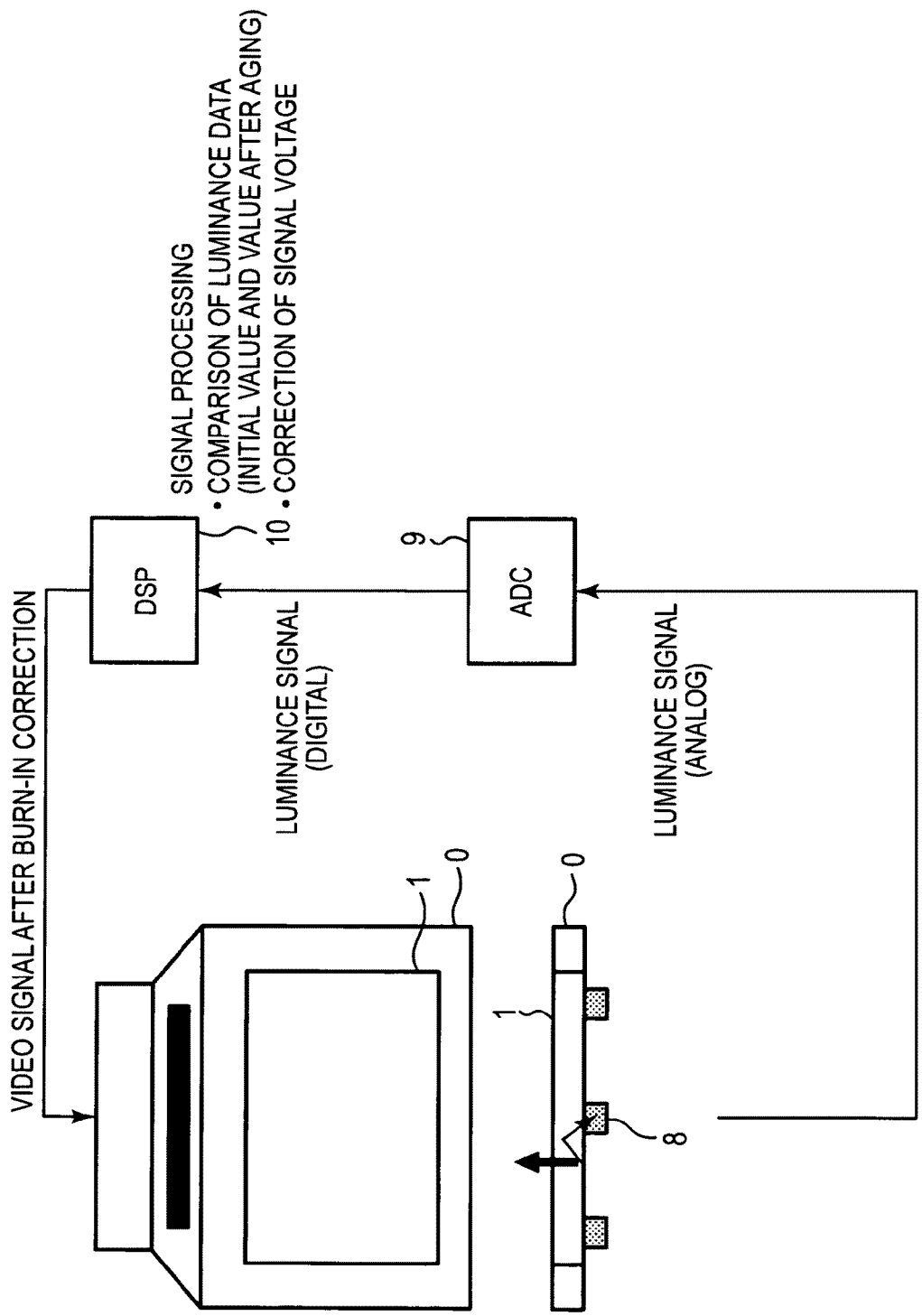
FIG. 5 is a block diagram showing the whole configuration of the first embodiment.

FIG. 5 is a schematic block diagram showing the whole configuration of the display device according to the embodiment of the invention. As shown in the drawing, the display device basically includes a screen unit 1, a drive unit and a signal processing unit 10. The screen unit (pixel array unit) 1 has a panel "0" including rows of scanning lines, columns of signal lines, matrix-state pixels arranged at portions where respective scanning lines and respective signal lines intersect and a light sensor 8. The drive unit includes a scanner sequentially supplying a control signal to respective scanning lines and a driver supplying a video signal to respective signal lines. The scanner and the driver are mounted on the panel "0" so as to surround the screen unit 1 in the embodiment.

Each pixel included in the screen unit 1 takes a video signal from a corresponding signal line as well as emits light in accordance with the taken video signal when the pixel is selected in accordance with the control signal supplied from a corresponding scanning line. The light sensor 8 detects light emitting luminance of each pixel and outputs a corresponding luminance signal. In the embodiment, the light sensor 8 is mounted on the reverse side (opposite side to the light emitting surface) of the panel "0".

The signal processing unit (DSP) 10 corrects the video signal in accordance with the luminance signal outputted from the light sensor 8 as well as supplies the corrected video signal to the driver in the drive unit. In the embodiment, an AD converter (ADC) 9 is inserted between the light sensor 8 and the signal processing unit 10. The ADC 9 converts the analog luminance signal outputted from the light sensor 8 into a digital luminance signal (luminance data) and supplies the signal to the digital signal processing unit (DSP) 10.

As a feature matter of the embodiment of the invention, the screen unit 1 is sectioned into plural regions in a range in which these regions do not interfere with one another. The drive unit allows pixels belonging to different regions to emit light at the same time and detects light emitting luminances of these plural pixels at the same time. It is possible to shorten time necessary for correcting video signals by detecting light emitting luminances of plural pixels at the same time. The plural regions including adjacent regions are sectioned in the range in which they do not interfere with one another, therefore, there is not a danger that emitted lights are substantially mixed together even when respective pixels emit light simultaneously at adjacent regions. Accordingly, light emitting luminance of each pixel can be precisely measured.

In the embodiment, particularly, plural light sensors 8 are arranged so as to correspond to plural regions in the screen 1. The light sensor 8 detects light emitting luminances of pixels belonging to a corresponding region. The total number of light sensors can be drastically reduced as compared with the case in which one light sensor is formed with respect to one pixel.

MODIFICATION EXAMPLE

Figure 6:
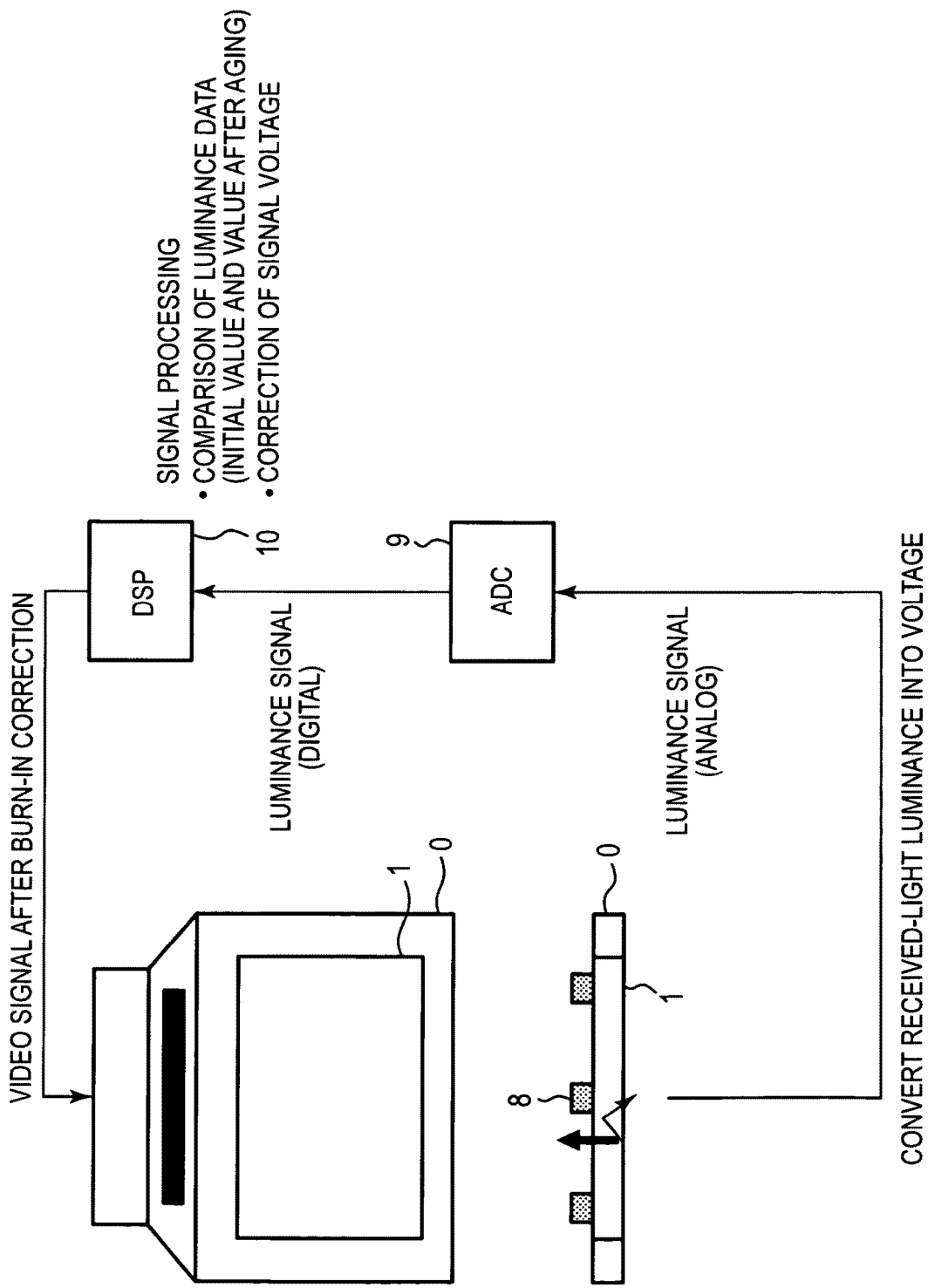
FIG. 6 is a block diagram also showing the whole configuration.

FIG. 6 is a block diagram showing a modification example of the display device according to the first embodiment shown in FIG. 5. In order to make understanding easier, corresponding reference numerals are given to portions corresponding to components shown in FIG. 5. A different point is that the light sensor 8 is arranged on the surface side, not on the reverse side, of the panel "0". When the light sensor 8 is arranged on the surface side, there is an advantage that the light receiving amount is increased as compared with the case of the reverse side. However, when the light sensor 8 is arranged on the surface side of the panel "0", there occurs a disadvantage that light emission from part of pixels is sacrificed.

[Configuration of the Panel]

Figure 7:
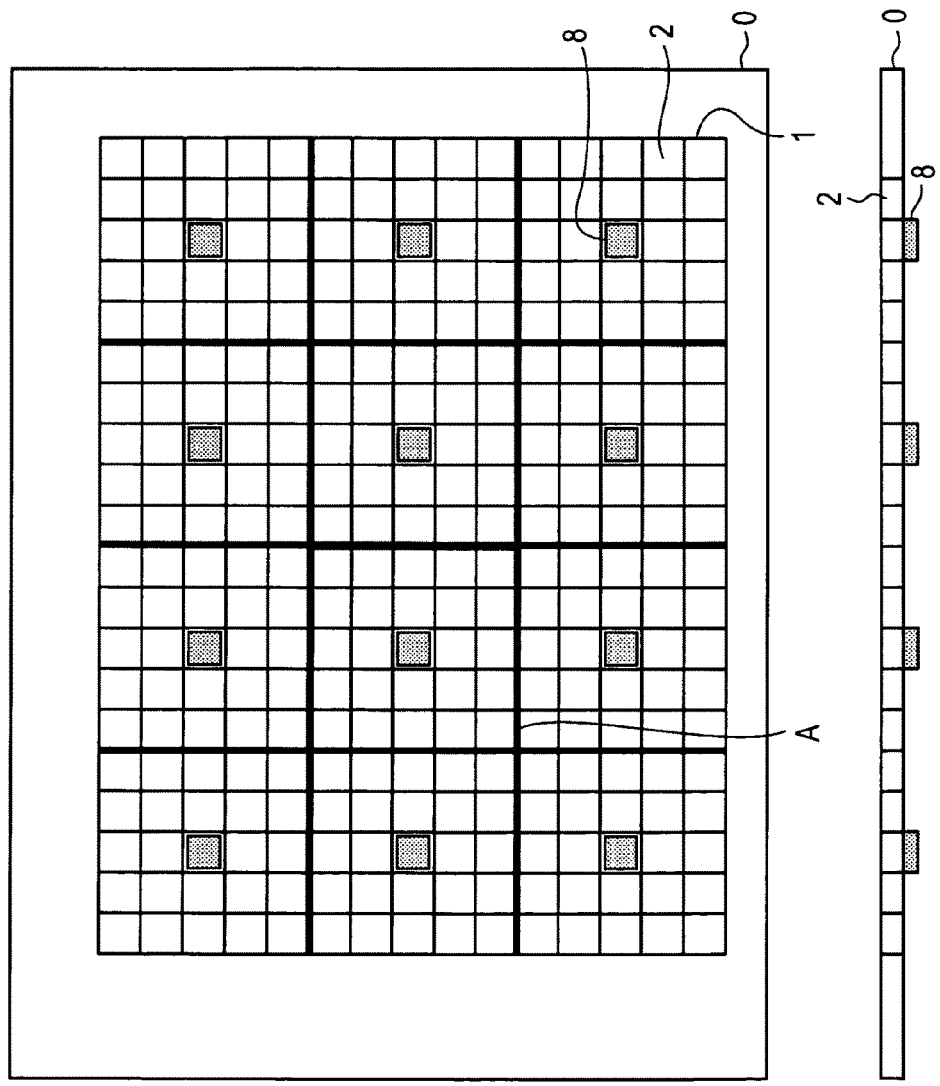
FIG. 7 shows a schematic plan view and a cross-sectional view of the panel included in the display device according to the first embodiment.

FIG. 7 shows a schematic plan view and a cross-sectional view showing a configuration of the panel included in the display device shown in FIG. 5. As shown in the drawing, the screen unit 1 of the panel "0" is sectioned into plural regions A. In the example, the screen unit includes pixels 2 of 15 rows and 20 columns. The pixels of 15 rows and 20 columns are sectioned into twelve regions A. Each region A includes pixels of 5 rows and 5 columns. The sections of the regions A are set in a range in which the regions do not interfere with one another. In other words, the shape and size of sections are set in a range in which emitted lights are not substantially mixed together even when pixels emit light simultaneously at adjacent regions A.

On the reverse side of the panel "0", plural light sensors 8 are arranged so as to correspond to plural regions in the screen unit 1. In the embodiment, the light sensor 8 is positioned at the center of a corresponding region A. Each light sensor 8 detects light emitting luminances of pixels belonging to a corresponding region A. Accordingly, in the embodiment of the invention, one light sensor 8 is arranged with respect to plural pixels belonging to one region A. Light receiving operations of the plural light sensors 8 arranged so as to correspond to plural regions A are processed in parallel. Accordingly, the number of light sensors 8 can be drastically reduced and light receiving time is also drastically reduced at the same time. As a result, costs for a video signal correction system can be reduced as well as the speed of the system can be increased.

[Cross-sectional Structure of the Panel]

Figure 8:
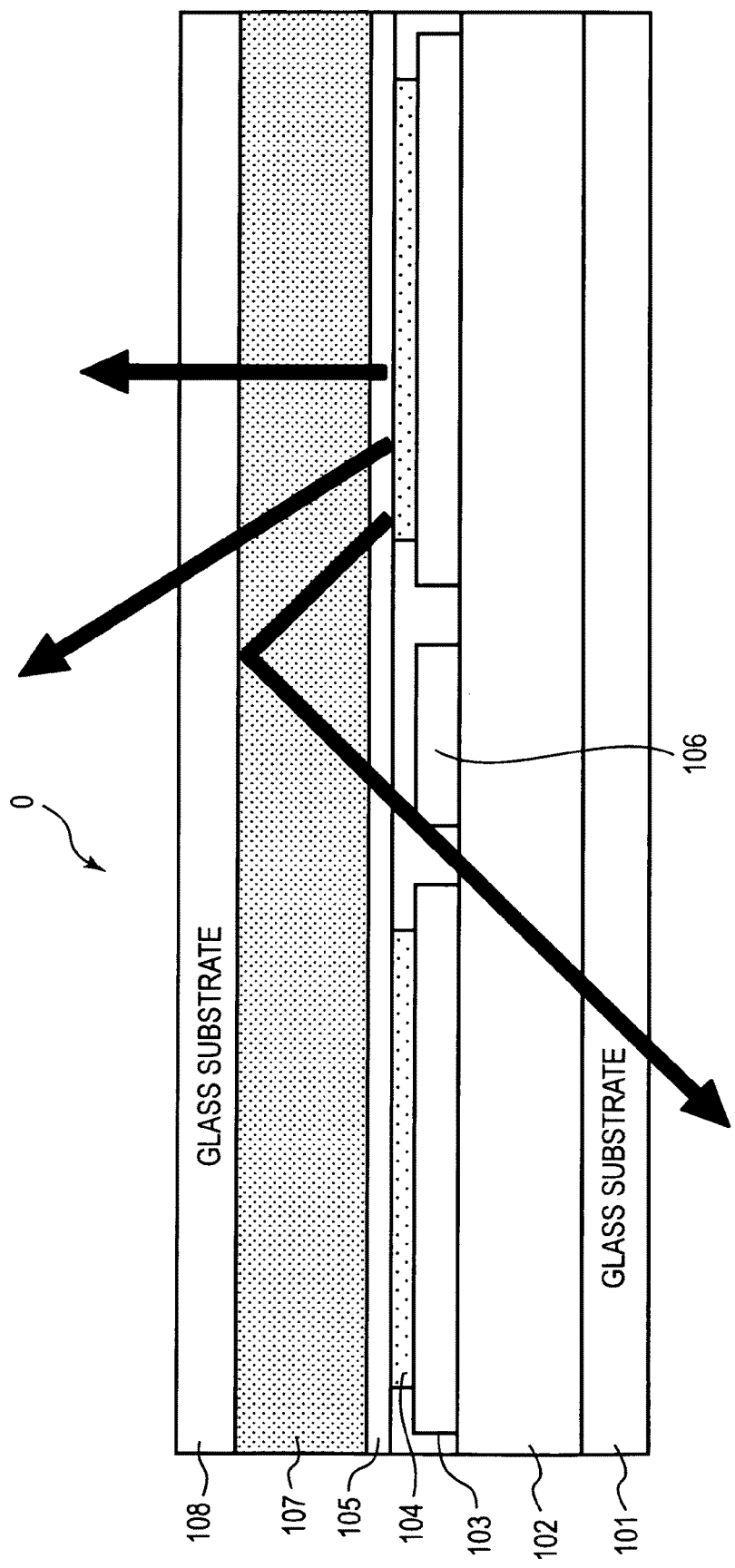
FIG. 8 is an enlarged cross-sectional view of a panel.

FIG. 8 shows a cross-sectional structure of the panel shown in FIG. 7. The panel "0" has a structure in which a lower glass substrate 101 and an upper glass substrate 108 are stacked. An integrated circuit 102 is formed over the glass substrate 101 by a TFT process. The integrated circuit 102 is an aggregation of pixel circuits shown in FIG. 2. On the integrated circuit 102, anodes 103 of the light emitting elements EL are formed separately in each pixel. Wirings 106 for connecting respective anodes 103 to the integrated circuit 102 side are also formed. A light emitting layer 104 made of an organic EL material and the like is formed over the anodes 103. A cathode 105 is formed over the whole surface further thereon. The cathode 105, the anode 103 and the light emitting layer 104 held between the both make a light emitting element. Over the cathode 105, the glass substrate 108 is bonded through a sealing layer 107.

The organic EL light-emitting element is a self-luminous device. Emitted light is mostly directed to the surface direction (direction of the upper glass substrate 108) of the panel "0". However, there are a light which is emitted obliquely and a light which is reflected and scattered repeatedly inside the panel "0" and penetrates to the reverse side (direction of the lower glass substrate 101) of the panel "0". In the example shown in FIG. 5, the light sensor is mounted on the reverse side of the panel "0", which detects emitted light penetrating from the light emitting element to the reverse side of the panel "0". In this case, not only light emission from the pixel just above the light sensor but also light emitting luminance of peripheral pixels shifted from the position just above the sensor can be also measured.

[Distribution of Received Light Amount by the Light Sensor]

FIG. 9 shows graphs representing distribution of the amount of light received by the light sensor. (X) represents the distribution of received light in the row direction. A horizontal axis indicates the distance from the light sensor by the number of pixels and a vertical axis indicates the sensor output voltage. The sensor output voltage is in proportion to the amount of received light. As apparent from the graph, the light sensor receives not only light emission from the pixel positioned at the center (pixel positioned just above the sensor) but also light emission from pixels apart from the center to some degree and outputs corresponding luminance signals.

(Y) represents distribution of the amount of light received by the light sensor along the column direction. It is found that the light sensor receives not only light emission from the central pixel but also light emission from peripheral pixels to some degree and can output corresponding luminance signals also in the column direction in the same manner as the distribution of the amount of received light in the row direction shown in (X).

In the embodiment of the invention, one light sensor is arranged with respect to plural pixels by utilizing the fact that the distribution of the amount of light received by the light sensor has some degree of width in the region. Accordingly, it is possible to reduce the number of light sensors and to drastically reduce costs in the burn-in correction system. Considering the distribution of the amount of light received by the light sensor (distribution of received light intensity) shown in FIG. 9, the range (region) measured by one light sensor is desirable to be the range in which distances to the light sensor are equal in all directions, up and down, left and right. In other words, it is desirable that the light sensor is arranged at the center of each sectioned region.

[Detection Operation of Light Emitting Luminance 1]

FIG. 10A is a schematic diagram showing a sequence of a detection operation of light emitting luminance. As shown in the upper left in the drawing, the screen unit 1 includes pixels 2 of 10 rows and 10 columns, which is sectioned into four regions from a region A1 to a region A4. Each region A includes pixels of 5 rows and 5 columns. The light sensor 8 is arranged at the center of each region A.

In a first frame 1, pixels at the upper left corner in pixels belonging to respective regions emit light at the same time. All the remaining pixels are in a light-out state. In other words, the video signal for detection is written in pixels positioned at the upper left corner in respective regions to allow the pixels to emit light in the frame 1, and a black-level signal is written in the remaining pixels to allow the pixels to be in the non-light emitting state. Accordingly, it is possible to allow pixels of detection targets to emit light at respective regions.

Emitted Lights from lit pixels are received by corresponding light sensors 8. At that time, emitted lights from pixels which emit light at adjacent regions at the same time are set so as not to be mixed together. In the shown example, emitted light of a pixel which emits light at an upper left corner of the region A1 is not substantially mixed with light emission of a pixel which emits light at an upper left corner of the region A2. Similarly, a lit pixel at the region A1 does not interfere with a pixel which emits light at the same time at the region A3. A lit pixel at the region A4 does not interfere with a lit pixel at the region A1.

When proceeding to a next frame 2, the display pattern is rewritten by the line-sequential scanning of the screen unit 1. Pixels in the second position from the upper left corner at respective regions A emit light. Lights from pixels which emit light simultaneously at respective regions are received by corresponding light sensors 8 respectively, and corresponding luminance signals are outputted. Accordingly, respective pixels are lit in a dot-sequential manner in each region, and the light receiving operation proceeds. In a frame 5, pixels at the upper right corner in pixels belonging to respective regions emit light, and the remaining pixels are put into the light-out state. Accordingly, light emitting luminances of five pixels belonging to the first row at respective regions are detected in a dot-sequential manner in frames 1 to 5.

When proceeding to a next frame 6, pixels at the top of the second line at respective regions emit light and the remaining pixels are in the light-out state. After that, the operation proceeds to a frame 7 in the same manner, and the detection operation of pixels in the second line at respective regions is completed in a frame 10. Accordingly, light emitting luminances of pixels included in one screen can be detected in the total 25 frames. In the case of the display having 30 Hz frame frequency, the detection of light emitting luminances of all pixels is completed for one second or less.

As described above, the signal processing unit of the display device according to the embodiment of the invention supplies a normal video signal during a display period in which video is displayed in the screen unit 1, while the unit supplies a video signal for luminance detection to the screen unit 1 during a detection period included in a non-display period in which video is not displayed. The signal processing unit supplies the video signal for detection in each frame. The video signal for detection allows only pixels of detection targets to emit light and allows the remaining pixels to be in the non-light emitting state in one frame.

According to the embodiment of the invention, the pixels 2 in a range in which one light sensor can receive light are allowed to emit light pixel-by-pixel in a dot-sequential manner. Moreover, the light emission is performed with respect to plural light sensors 8 at the same time. Accordingly, the light receiving operations can be processed in parallel, which drastically reduces the luminance detection time. In the detection operation, pixels 2 the number of which is the same number as the light sensors 8 emit light at the same time in one panel "0", and the light emission is repeated by a dot-sequential drive.

The control of simultaneous light emission in plural pixels is performed by the video signal to be inputted to the panel. Operation timing of pixels is controlled by the line-sequential scanning by the scanner in the same manner as the normal display period. In order to prevent occurrence of measurement error, the black-level video signal is inputted to pixels other than pixels of measurement targets. According to the above operation, light-emitting luminance data of plural pixels can be obtained simultaneously as well as sequentially by the plural light sensors, which can drastically reduce the light receiving time. It is desirable that the detection of light emitting luminance is performed pixel-by-pixel. In the case of color display, each pixel includes a pixel emitting green light, a pixel emitting red light and a pixel emitting blue light. In this case, light emitting luminance is desirable to be detected pixel-by-pixel to prevent different color lights from being mixed together. Considering the light-receiving sensitivity of the light sensor, the region measured by one light sensor is desirable to be the range in which distances to the light sensor are equal in all directions, up and down, left and right.

[Detection Operation of Light Emitting Luminance 2]

FIG. 10B is a schematic diagram showing another example of the light emitting sequence shown in FIG. 10A. In the example, pixels are lit at respective regions dot-sequentially in the same manner as the previous example shown in FIG. 10A. However, the example differs from the previous example in a point that moving directions of dot-sequential drive are reverse between adjacent regions. In the frame 1, pixels which emit light at adjacent regions are apart from each other at the farthest positions. In the frame 5, pixels which emit light simultaneously at adjacent regions in the row direction come close to each other again. In this case, in order to prevent lights emitted from adjacent pixels from being mixed together, light shielding walls may be provided along sections of respective regions. Subsequently, dot-sequential light emission of pixels proceeds frame-by-frame. In the last frame 25, four pixels closest to the center emit light simultaneously at four regions arranged in a square shape though not shown, and the light emitting luminances of all pixels included in the screen unit 1 are measured.

[Timing Chart of Light Receiving Operation]

FIG. 10C shows timing charts representing the light emitting operation shown in FIG. 10A. (A) represents a case in which plural sensors are simply driven for comparison. First, pixels included in the region covered by a sensor 1 are driven dot-sequentially and respective light emitting luminances are measured. At the time when the light receiving operation by the sensor 1 is completed, operation proceeds to a sensor 2. Light emitting luminances of pixels covered by the sensor 2 are sequentially measured. In this manner, light emitting luminances of pixels covered by the last sensor N are measured. Accordingly, all light emitting luminances of pixels included in one screen can be measured. In the case of the simple drive of plural sensors, there is a disadvantage that it takes a long time for measuring all light emitting luminances of pixels in one screen. For example, referring to the configuration example of the screen shown in FIG. 7, there are twelve sensors (N=12) and pixels included in the region covered by each sensor is twenty five. Therefore, a period of time for 12×12=300 frames is necessary for completing measurement of one screen.

On the other hand, (B) represents a case in which plural sensors performs parallel drive in accordance with the embodiment of the invention. In the embodiment, light emitting luminances of pixels are simultaneously detected by corresponding twelve light sensors from the sensor 1 to the sensor N respectively. Pixels of detection targets are selected dot-sequentially in the regions associated with respective sensors. Therefore, measurement of light emitting luminances of all pixels included in the screen unit is completed in 25 frames. The parallel drive of plural sensors shown in (B) can remarkably shorten measurement time for light emitting luminance as compared with the simple drive of plural sensors.

[Burn-in Phenomenon]

FIG. 11 is a schematic view explaining "burn-in" as a processing target of the embodiment of the invention. (A1) represents a pattern display as a cause of burn-in. For example, a window as shown in the drawing is displayed in the screen unit 1. Pixels in a portion of a white window continue emitting light at high luminance, while pixels in a peripheral black frame portion are put into the non-light emitting state. When this window pattern is displayed over a long period of time, luminance deterioration of pixels of the white portion proceeds, while luminance deterioration of pixels in the black frame portion proceeds relatively slowly.

(A2) represent a state in which the window pattern display shown in (A1) is deleted and an all-over raster display is performed in the screen unit 1. If there is no partial deterioration, luminance distribution which is uniform in the whole screen can be obtained when performing the raster display in the screen unit 1. However, luminance deterioration of pixels at the central portion previously displayed in white proceeds in fact, therefore, luminance at the central portion becomes lower than luminance of the peripheral portion, and "burn-in" appears as shown in the drawing.

[Burn-in Correction Processing]

Figure 12:
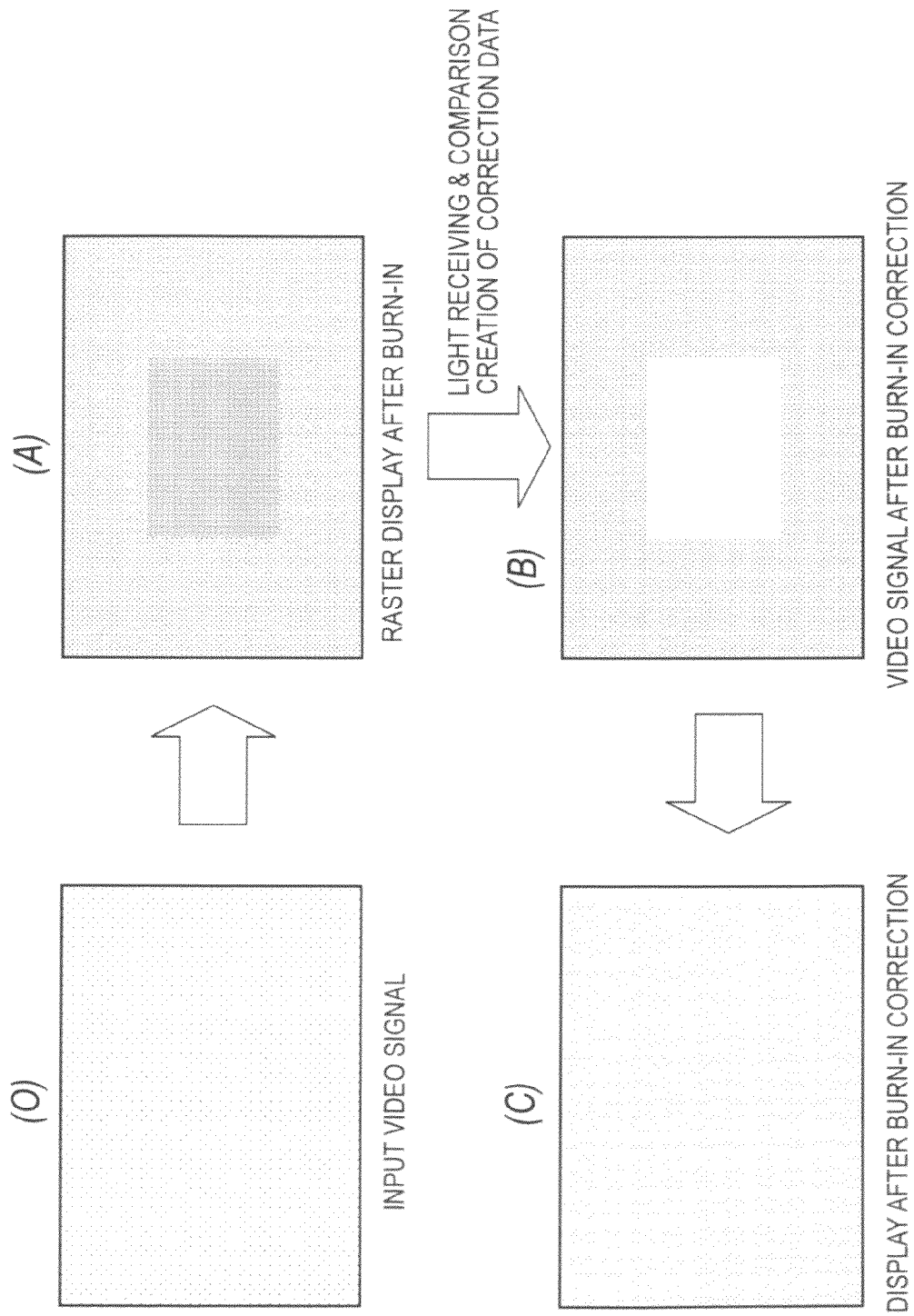
FIG. 12 is a schematic diagram showing a making operation of a video signal.

FIG. 12 is a schematic view showing a correction operation of "burn-in" shown in FIG. 11. (O) represents a video signal inputted to the signal processing unit of the display device from the outside. In the example, an all-over video signal is shown.

(A) represents luminance distribution when the video signal shown in (O) is displayed in the screen unit where "burn-in" as shown in FIG. 11 has already occurred. Even when the all-over video signal is inputted, there exists a partial burn-in in the screen unit of the panel, and therefore, luminance of a window portion at the center is darker than a peripheral frame portion.

(B) represents a video signal obtained by correcting the video signal (O) inputted from the outside in accordance with the detection result of light emitting luminances of respective pixels. In the video signal after the burn-in correction shown in (B), the level of the video signal to be written in pixels at the central window portion is corrected to be relatively high and the level of the video signal to be written in pixels at the peripheral frame portion is corrected to be relatively low. As described above, the correction is performed in order that the video signal has positive luminance distribution shown in (B) for cancelling negative luminance distribution due to burn-in shown in (A).

(C) schematically represents a state in which the video signal after the burn-in correction is displayed in the screen unit. Nonuniform luminance distribution due to burn-in remaining in the screen unit of the panel is compensated by the video signal for burn-in correction and the screen having uniform luminance distribution can be obtained.

As described above, in the present correction system, light emitting luminance of each pixel is measured by the light sensor, for example, at the time of factory shipping. The luminance data is outputted from the light sensor, converted into digital data and stored in a memory. After a given time has passed, luminance data measured in the same manner is outputted. The luminance data is compared with an initial value to calculate the reduction amount of light emitting luminance. The signal voltage of each pixel is adjusted based on the luminance reduction data obtained by the comparison to correct the burn-in.

Second Embodiment

[Timing Chart]

Figure 13:
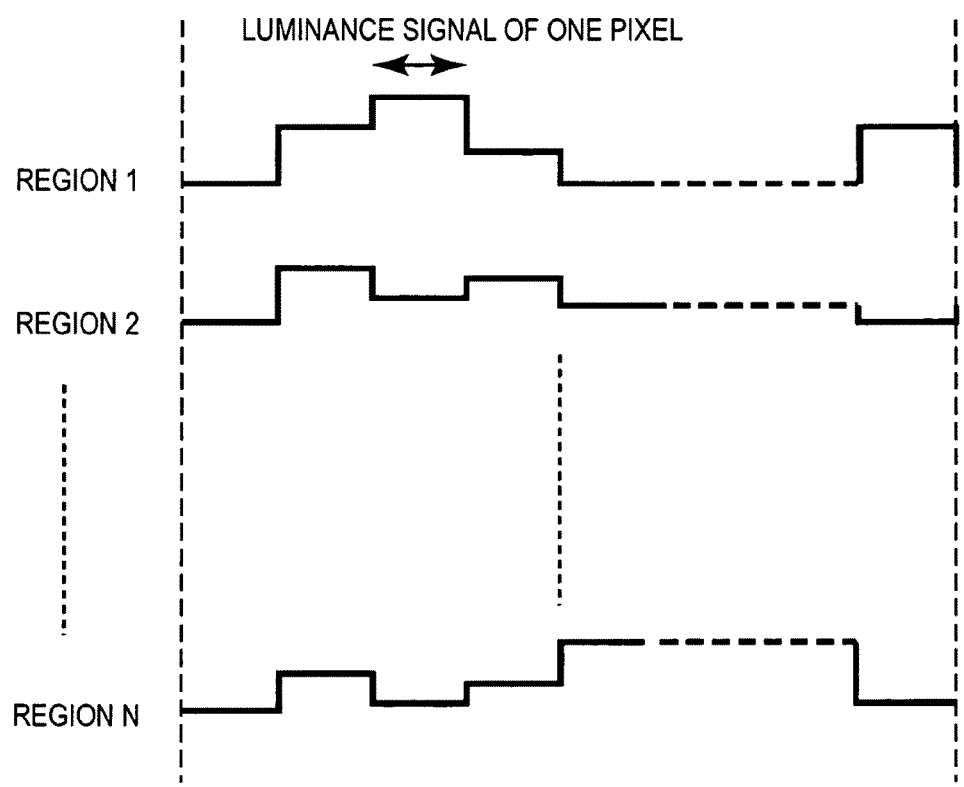
FIG. 13 is a timing chart of a display device according to a second embodiment of the invention.

FIG. 13 is a timing chart of a display device according to a second embodiment of the invention. In order to make understanding easier, the same notation as the timing chart of the first embodiment shown in FIG. 10C is applied. The embodiment differs from the first embodiment in a point that plural optical sensors are not assigned to plural regions. Instead of that, detection of light emitting luminances of pixels is performed by a light sensor common to plural regions 1 to N. Also in this case, pixels simultaneously emit light in respective regions. The common light sensor detects light emitting luminances of pixels which simultaneously emit light in one frame in a time division manner in the same one frame. In this manner, the common light sensor measures light emitting luminances of pixels as detection targets in respective regions in a period of time of one frame. When the operation proceeds to a next frame, pixels which are next detection targets emit light simultaneously at respective regions. In this frame, the common sensor measures light emitting luminances of pixels which simultaneously emit light in the time division manner or by multiplexing, and outputs serial luminance signals.

Third Embodiment

[Panel Configuration]

Figure 14:
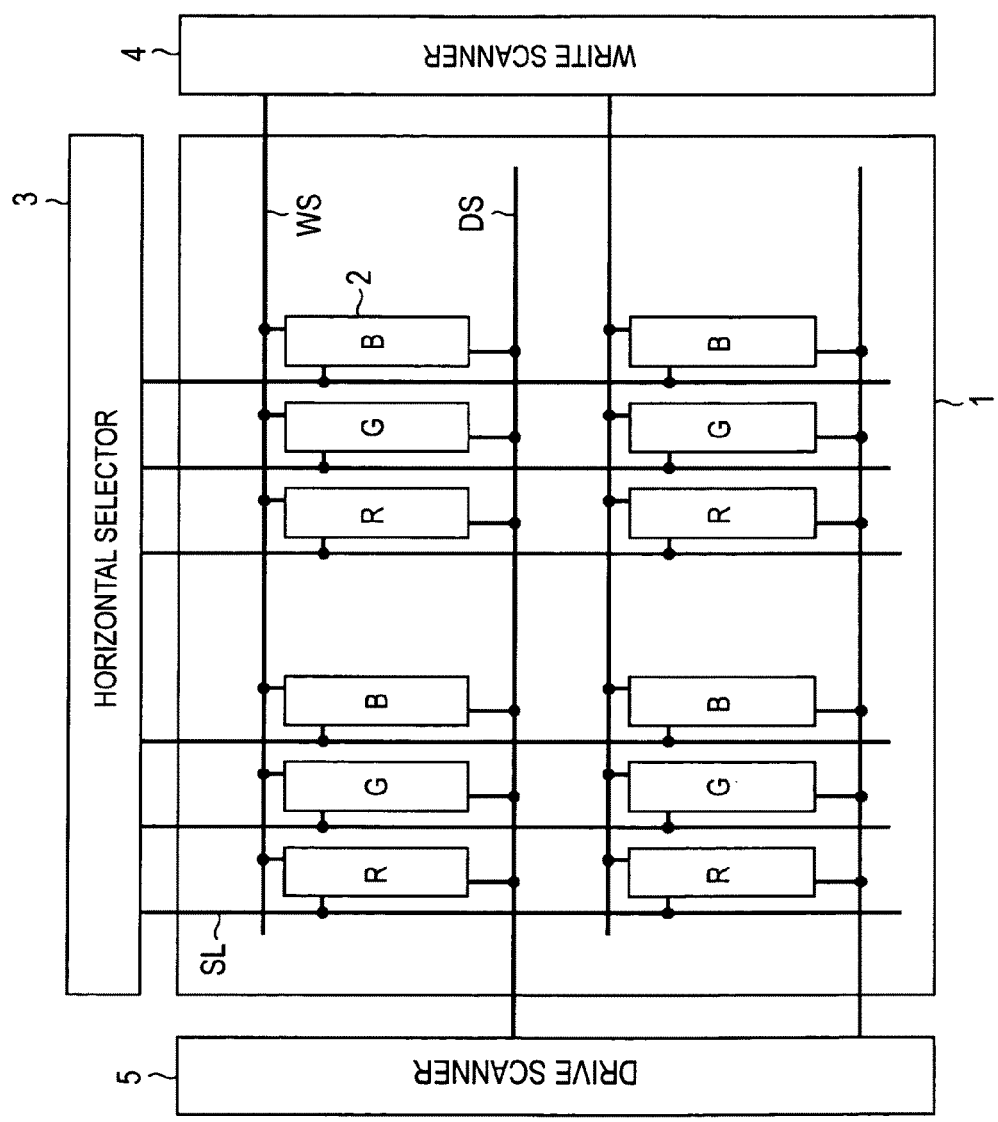
FIG. 14 is a block diagram showing a panel configuration of a display device according to a third embodiment of the invention.

FIG. 14 is a block diagram showing a panel configuration of a display device according to a third embodiment of the invention. In order to make understanding easier, the codes which are the same as the panel block diagram of the first embodiment shown in FIG. 1 are applied. The display device basically includes a pixel array unit (screen unit) 1 and a drive unit which drives the pixel array unit 1. The pixel array unit 1 includes rows of first scanning lines WS, similarly, rows of second scanning lines DS, columns of signal lines SL, and matrix-state pixels 2 arranged at portions where respective first scanning lines WS and respective signal lines SL intersect. On the other hand, the drive unit includes a write scanner 4, a drive scanner 5 and a horizontal selector 3. The write scanner 4 performs line-sequential scanning of pixels 2 row by row by outputting a control signal to respective first scanning line WS. The drive scanner 5 also performs ling-sequential scanning of pixels 2 row by row by outputting a control signal to respective second scanning line DS. The timing in which the control signal is outputted differs in the write scanner 4 and the drive scanner 5. The drive scanner 5 is disposed in the drive unit instead of the power supply scanner 6 used in the first embodiment. Since the power supply scanner 6 is removed, the feeling lines are also removed from the pixel array unit 1. Instead of that, a power supply line supplying a fixed power supply potential Vdd is provided in the pixel array unit 1. The horizontal selector (signal driver) 3 supplies a signal voltage and a reference voltage of a video signal to columns of signal lines SL so as to correspond to the line-sequential scanning in the scanners 4 and 5.

[Configuration of a Pixel Circuit]

Figure 15:
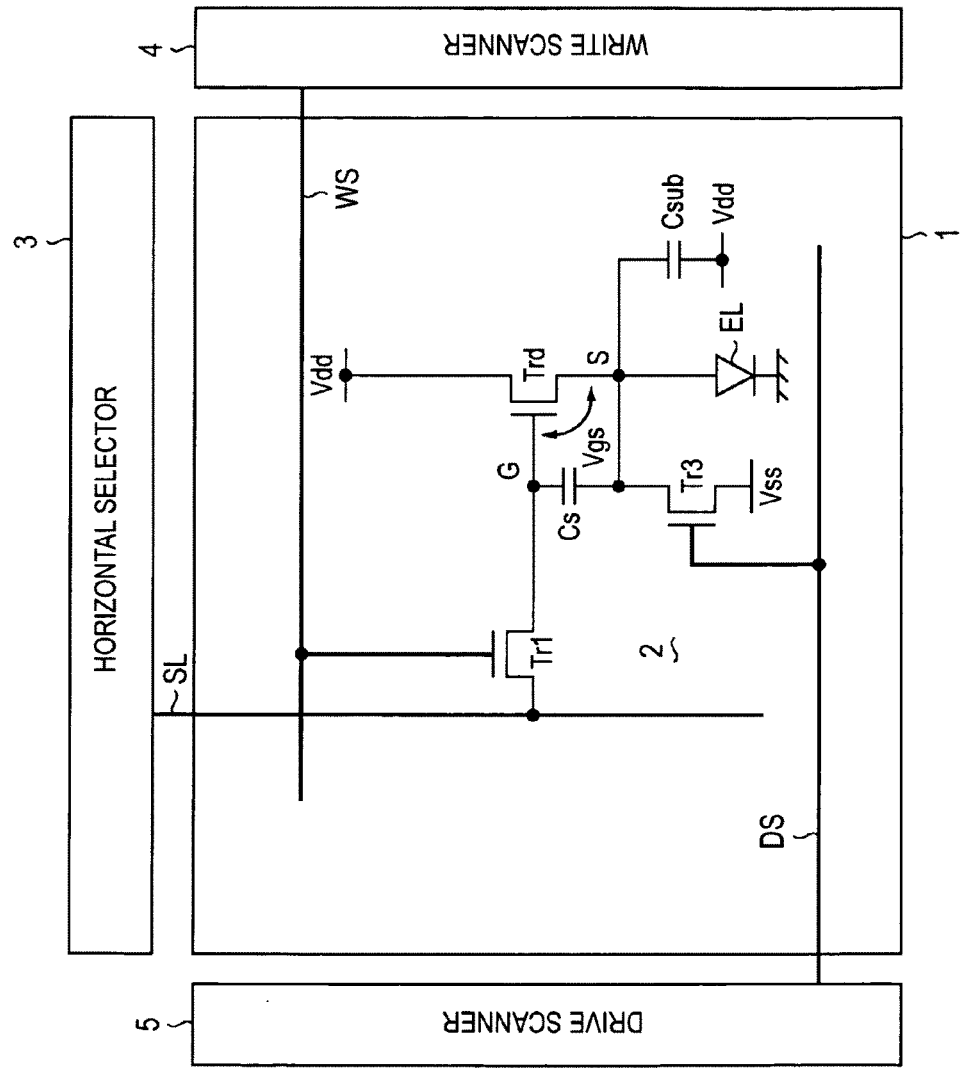
FIG. 15 is a circuit diagram showing a configuration of a pixel circuit.

FIG. 15 shows a configuration of a pixel configuration included in a display panel of the third embodiment shown in FIG. 14. The pixel circuit of the first embodiment has two transistors, while the pixel of the present embodiment includes three transistors. As shown in the drawing, the present pixel 2 basically includes a light emitting element EL, a sampling transistor Tr1, a drive transistor Trd, a switching transistor Tr3 and a pixel capacitor Cs. The sampling transistor Tr1 is connected to the scanning line WS at a control end (gate) thereof, connected to the signal line SL at one of a pair of current ends (source/drain) and connected to a control end (gate G) of the drive transistor Trd at the other of the current ends. The drive transistor Trd is connected to a power supply line Vdd at one (drain) of a pair of current ends (source/drain) and connected to an anode of the light emitting element EL at the other (source S) of the current ends. A cathode of the light emitting element EL is connected to a given cathode potential Vcath. The switching transistor Tr3 is connected to the scanning line DS at a control end (gate) thereof, connected to a fixed potential Vss at one of a pair of current ends (source/drain) and connected to a source S of the drive transistor Trd at the other end of the current ends. The pixel capacitor Cs is connected to the control end (gate G) of the drive transistor Trd at one end and connected to the other current end (source S) of the drive transistor Trd at the other end thereof. The other current end of the drive transistor Trd is an output current end with respect to the light emitting element EL and the pixel capacitor Cs. In the present pixel circuit 2, a subsidiary capacitor Csub is connected between the source S of the drive transistor Trd and the power supply Vdd for the purpose of subsidizing the pixel capacitor Cs.

In the above configuration, the write scanner 4 in the drive unit side supplies a control signal for performing switching control of the sampling transistor Tr1 to the first scanning line WS. The drive scanner 5 outputs a control signal for performing switching control of the switching transistor Tr3 to the second scanning line DS. The horizontal selector 3 supplies a video signal (input signal) switching between the signal potential Vsig and the reference potential Vref to the signal line SL. The potentials of the scanning lines WS, DS and signal lines SL vary in accordance with the line-sequential scanning as described above, however, the power supply line is fixed to Vdd. The cathode potential Vcath and the fixed potential Vss are also fixed.

Fourth Embodiment

[Block Configuration of a Display Panel]

Figure 16:
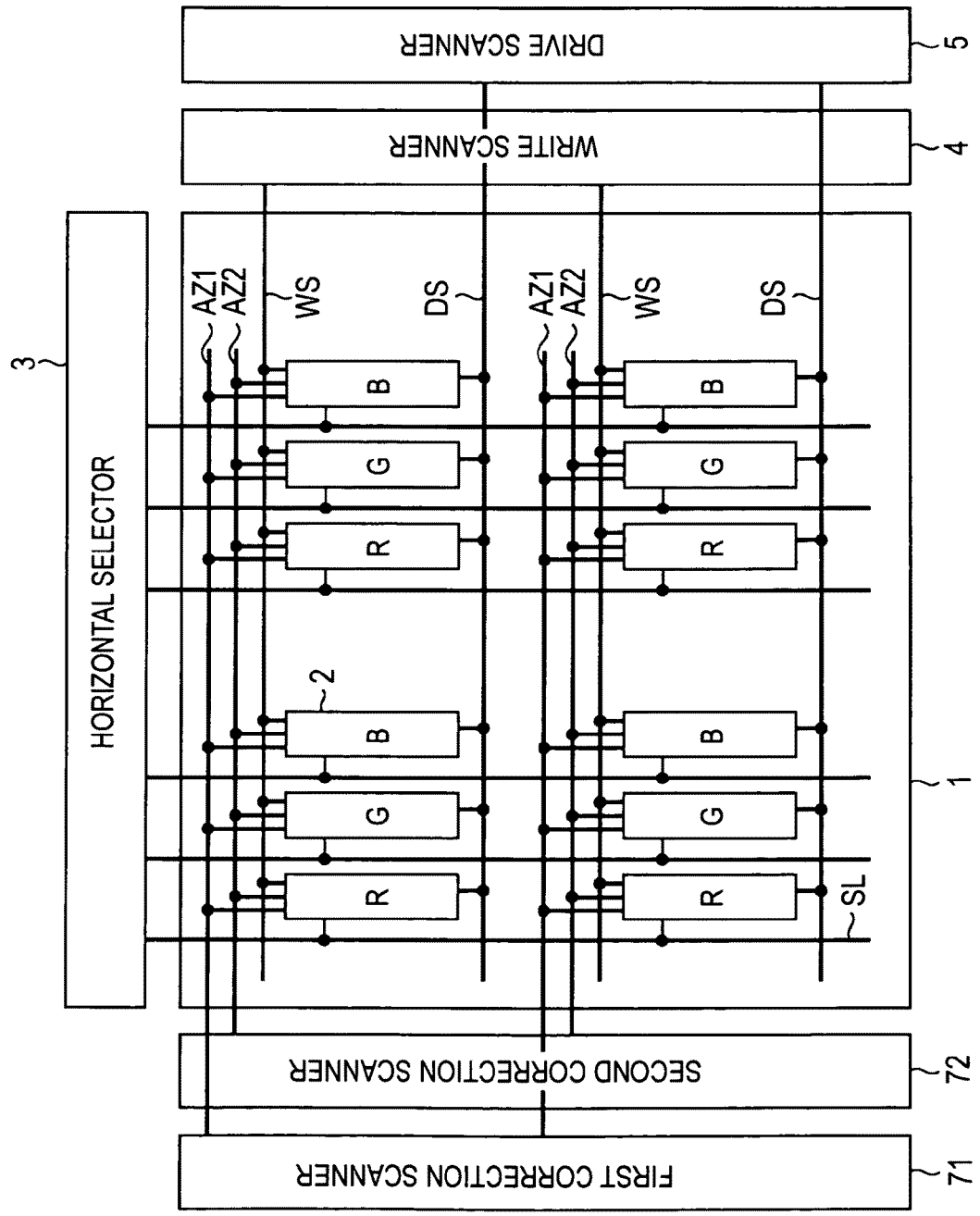
FIG. 16 is a block diagram showing a panel configuration of a display device according to a fourth embodiment of the invention.

FIG. 16 is a block diagram showing a display panel of a display device according to a fourth embodiment of the invention. The display device basically includes a pixel array unit 1, a scanner unit and a signal unit. The scanner unit and the signal unit make a drive unit. The pixel array unit 1 includes first scanning lines WS, second scanning lines DS, third scanning lines AZ1 and fourth scanning lines AZ2 arranged in rows, signal lines SL arranged in columns, matrix-state pixel circuits 2 connected to these scanning lines WS, DS, AZ1, AZ2 and the signal lines SL and plural power supply lines supplying a first potential Vss1, a second potential Vss2 and a third potential Vdd which are necessary for operations of respective pixel circuits 2. The signal unit includes a horizontal selector 3, which supplies video signals to the signal lines SL. The scanner unit includes a write scanner 4, a drive scanner 5, a first correction scanner 71 and a second correction scanner 72, which sequentially scan the pixel circuits 2 row by row by supplying control signals to the first scanning line WS, the second scanning line DS, the third scanning line AZ1 and the fourth scanning line AZ2.

[Configuration of a Pixel Circuit]

Figure 17:
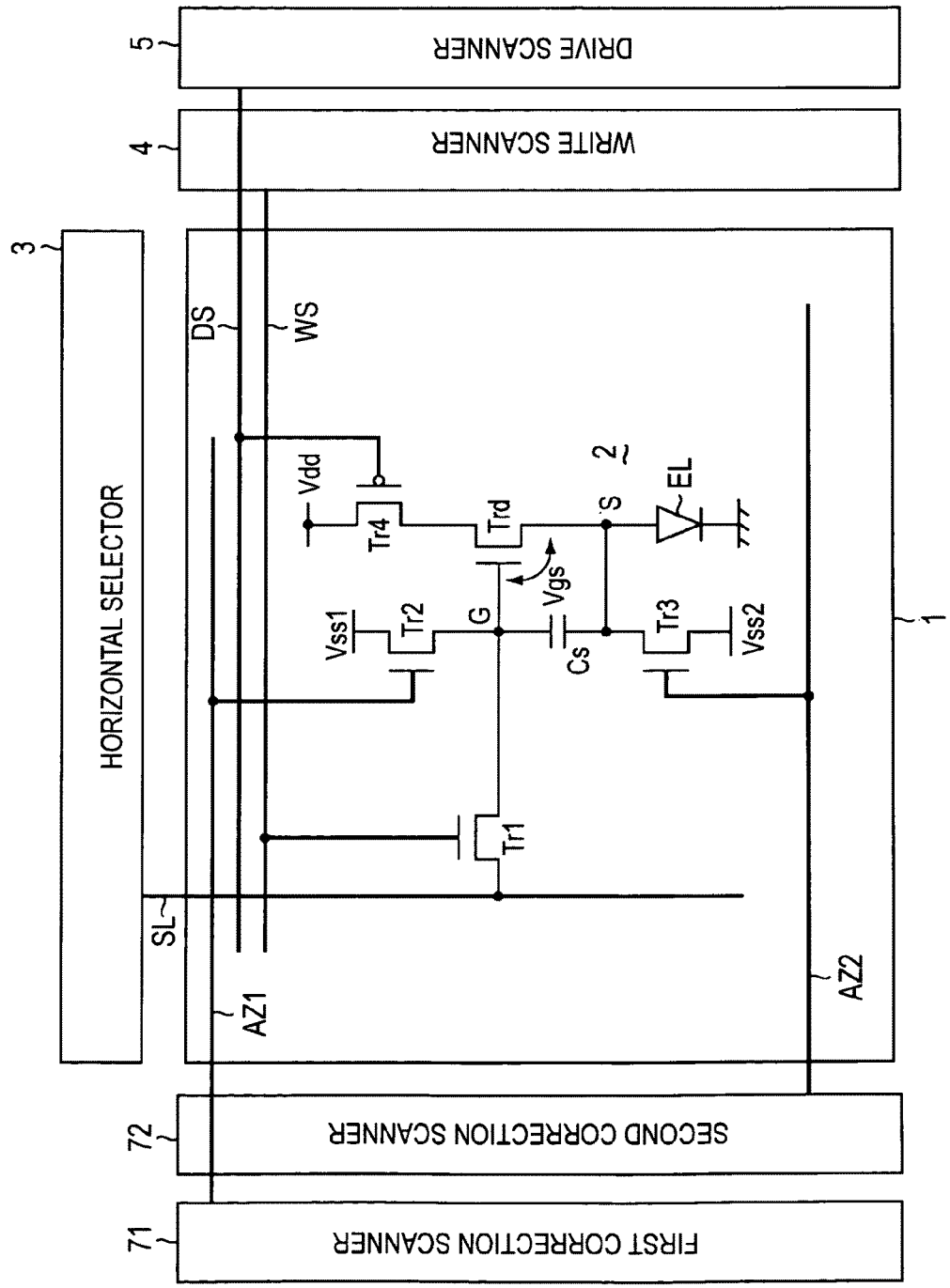
FIG. 17 is a pixel circuit diagram according to the fourth embodiment.

FIG. 17 is a circuit diagram showing a pixel configuration incorporated in the display device shown in FIG. 16. The pixel of the present embodiment is characterized by including five transistors. As shown in the drawing, the pixel circuit 2 includes a sampling transistor Tr1, a drive transistor Trd, a first switching transistor Tr2, a second switching transistor Tr3, a third switching transistor Tr4, a pixel capacitor Cs and a light emitting element EL. The sampling transistor Tr1 becomes conductive in accordance with the control signal supplied from the scanning line WS in a given sampling period, performs sampling of a signal potential of a video signal supplied from the signal line SL in the pixel capacitor Cs. The pixel capacitor Cs applies an input voltage Vgs to a gate G of the drive transistor Trd in accordance with the signal potential of the sampled video signal. The drive transistor Trd supplies an output current Ids corresponding to the input voltage Vgs to the light emitting element EL. The light emitting element EL emits light at luminance corresponding to the signal potential of the video signal by the output current Ids supplied from the drive transistor Trd during a given light emitting period.

The first switching transistor Tr2 becomes conductive in accordance with the control signal supplied from the scanning line AZ1 and sets the gate G as a control end of the drive transistor Trd to the first potential Vss1 before the sampling period (video signal writing period). The second switching transistor Tr3 becomes conductive in accordance with the control signal supplied from the scanning line AZ2 and sets a source S as one of current ends of the drive transistor Trd to the second potential Vss2 before the sampling period. The third switching transistor Tr4 becomes conductive in accordance with the control signal supplied from the scanning line DS and connects a drain as the other of the current ends of the drive transistor Trd to the third potential Vdd before the sampling period, thereby storing a voltage corresponding to a threshold voltage Vth of the drive transistor Trd in the pixel capacitor Cs to correct effects of the threshold voltage Vth. The third switching transistor Tr4 further becomes conductive in accordance with the control signal supplied from the scanning line DS again in the light emitting period and connects the drive transistor Trd to the third potential Vdd to allow the output current Ids to flow in the light emitting element EL.

As apparent from the above explanation, the pixel circuit 2 includes five transistors Tr1 to Tr4 and Trd, one pixel capacitor Cs and one light emitting element EL. The transistors Tr1 to Tr3 and Trd are an N-channel type polysilicon TFT. Only the transistor Tr4 is a P-channel type polysilicon TFT. However, the invention is not limited to this, and it is possible to mix N-channel type and P-channel type TFTs appropriately. The light emitting element EL is, for example, a diode-type organic EL device including an anode and a cathode. However, the invention is not limited to this, and the light emitting element includes all types of devices which commonly emit light by current drive.

APPLICATION EXAMPLE

Figure 18:
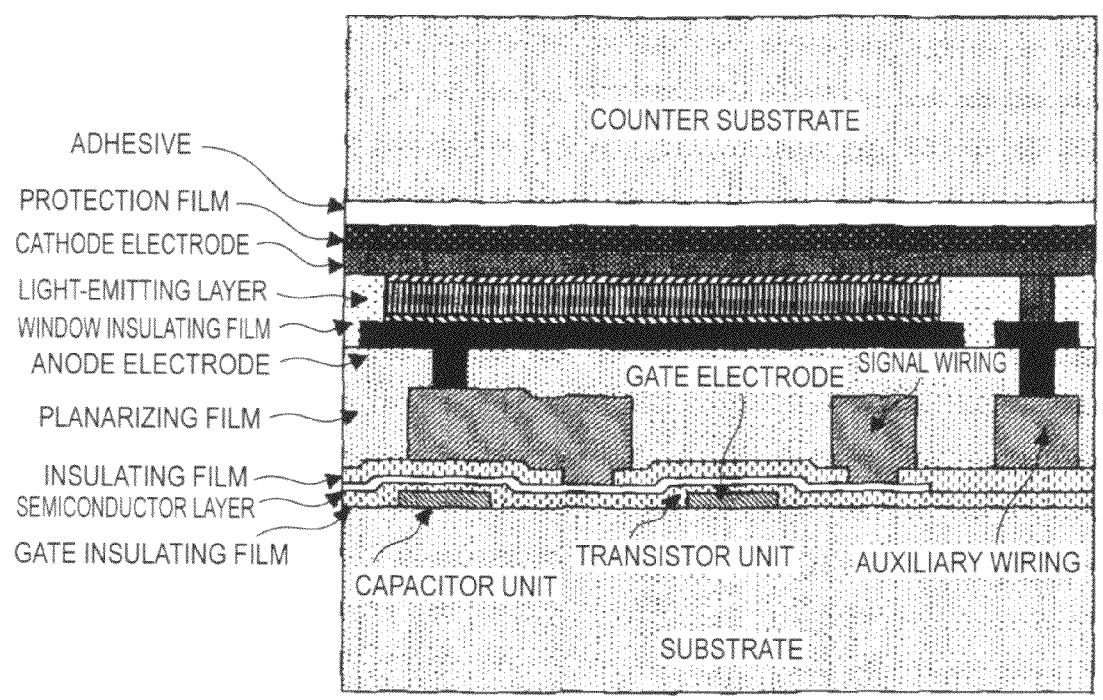
FIG. 18 is a cross-sectional view showing a device structure of a display device according to an application example of the invention.

The display device according to embodiments of the invention has a thin-film device structure as shown in FIG. 18. In FIG. 18, a TFT portion has a bottom gate structure (a gate electrode is positioned below a channel PS layer). Concerning the TFT portion, there are variations such as a sandwich gate structure (the channel PS layer is sandwiched by upper and lower gate electrodes) and a top gate structure (the gate electrode is positioned above the channel PS layer). The drawing shows a schematic cross-sectional structure of a pixel formed on an insulative substrate. As shown in the drawing, the pixel has a transistor unit including plural transistors (one TFT is shown as an example in the drawing), a capacitor unit including a pixel capacitor and the like, and a light emitting unit including an organic EL element and the like. On the substrate, the transistor unit and the capacitor unit are formed by a TFT process, then, the light emitting unit such as the organic EL element is stacked thereon. Further, a transparent counter substrate is bonded thereon through an adhesive to obtain a flat panel.

Figure 19:
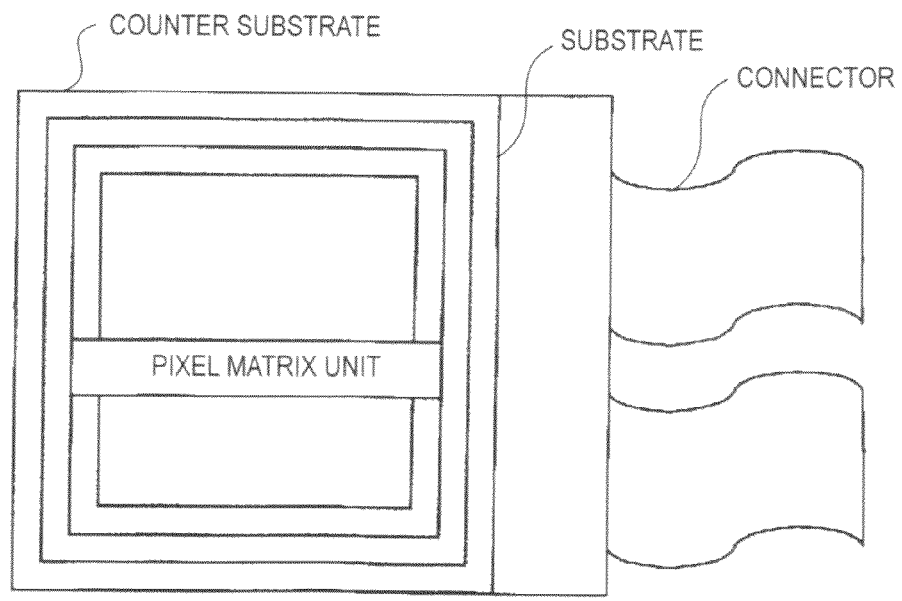
FIG. 19 is a plan view showing a module structure of the display device according to the application example of the invention.

The display device according to the embodiments of the invention includes a flat-module shaped device as shown in FIG. 19. For example, a pixel array unit in which pixels each having an organic EL element, a thin-film transistor, a thin-film capacitor and the like are integrally formed in a matrix state is provided, and a counter substrate made of glass or the like is bonded by arranging an adhesive so as to surround the pixel array unit (pixel matrix unit) to obtain a display module. In the transparent counter substrate, color filters, a protection film, a shielding film and the like may be provided, if necessary. It is also preferable that the display module is provided with, for example, a FPC (flexible print circuit) as a connector for inputting and outputting signals and the like with respect to the pixel array circuit from the outside.

The display device according to the embodiments of the invention explained in the above includes the flat panel shape, which can be applied to various electronic products, for example, digital camera, a notebook personal computer, a cellular phone, a video camera and the like. The display device can be applied to displays of electronic products of various fields which can display a drive signal inputted to the electronic products or generated in the electronic product as an image or video. Examples of electronic products to which the above display device is applied will be shown below. The electronic product basically includes a main body which processes information and a display which displays information inputted to the main body or outputted from the main body.

Figure 20:
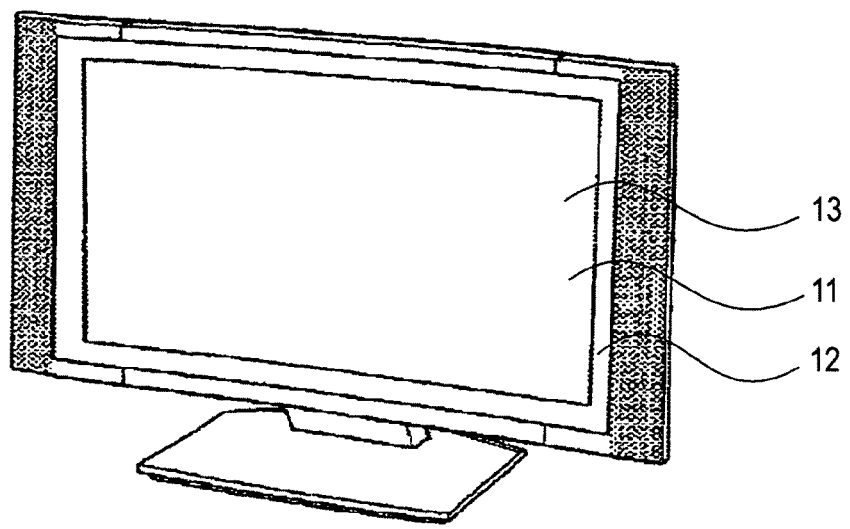
FIG. 20 is a perspective view showing a television set including the display device according to the application example of the invention.

FIG. 20 shows a television set to which the invention is applied, including a video display screen 11 having a front panel 12, a filter glass 13 and the like, which is fabricated by using the display device according to the embodiment of the invention as the video display screen 11.

Figure 21:
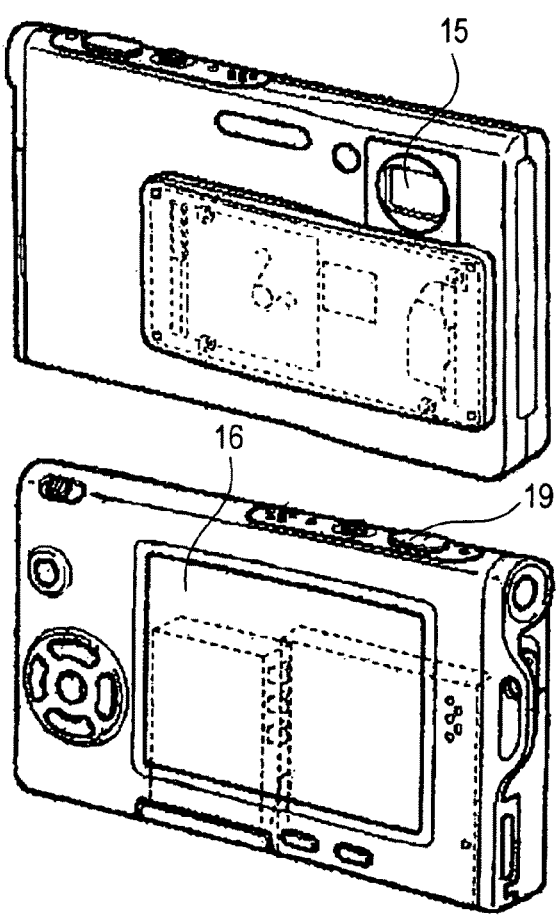
FIG. 21 is a perspective view showing a digital still camera including the display device according to the application example of the invention.

FIG. 21 shows a digital camera to which the invention is applied, the upper view is a front view and the lower view is a back view. The digital camera includes an imaging lens, a light emitting unit for flash 15, a display unit 16, a control switch, a menu switch, a shutter 19 and the like, which is fabricated by using the display device according to the embodiments of the invention as the display unit 16.

Figure 22:
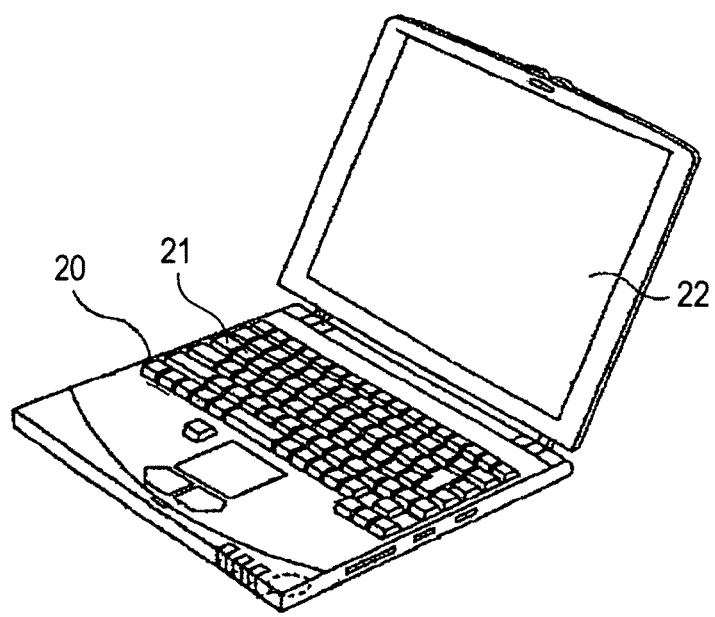
FIG. 22 is a perspective view showing a notebook personal computer including the display device according to the application example of the invention.

FIG. 22 shows a notebook personal computer to which the invention is applied, in which a main body 20 includes a keyboard 21 operated when inputting characters and the like, a main-body cover includes a display unit 22 displaying images, and which is fabricated by using the display device according to the embodiments of the invention as the display unit 22.

Figure 23:
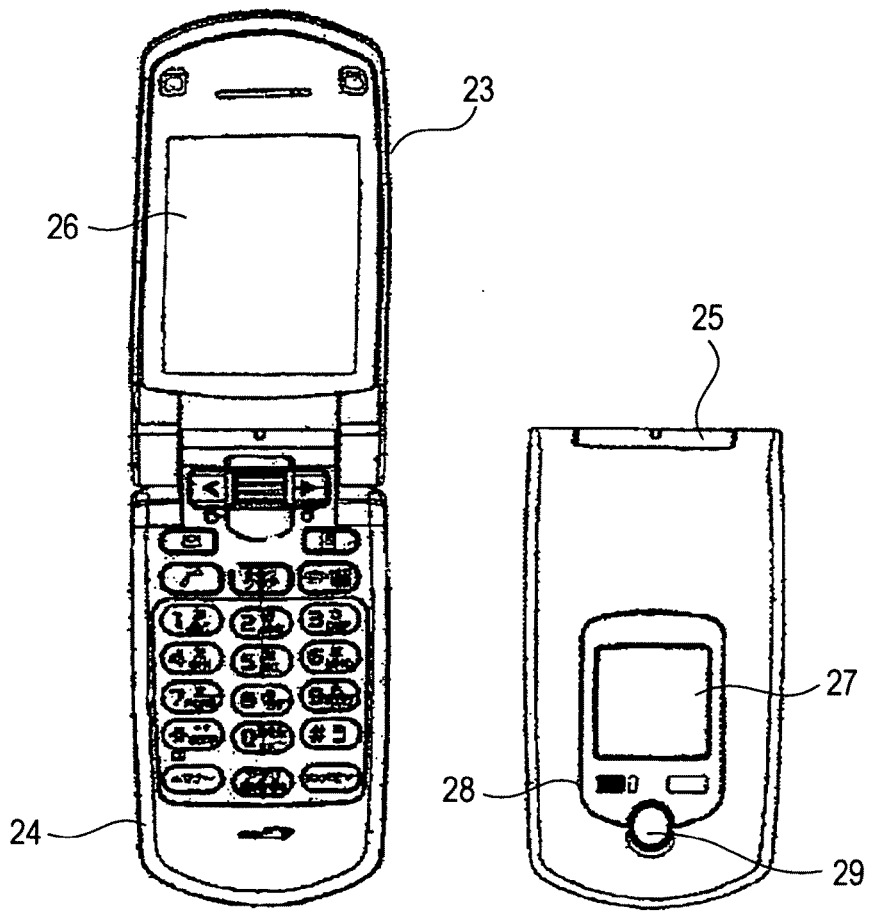
FIG. 23 is a schematic view showing a portable terminal device including the display device according to the application example of the invention.

FIG. 23 shows a portable terminal device to which the invention is applied. The left view represents an open state and the right view represents a closed state. The portable terminal device includes an upper casing 23, a lower casing 24, a connection unit (hinge unit in this case) 25, a display 26, a sub-display 27, a picture light 28, a camera 29 and the like. The portable terminal device is fabricated by using the display device according to the embodiments of the invention as the display 26 or the sub-display 27.

Figure 24:
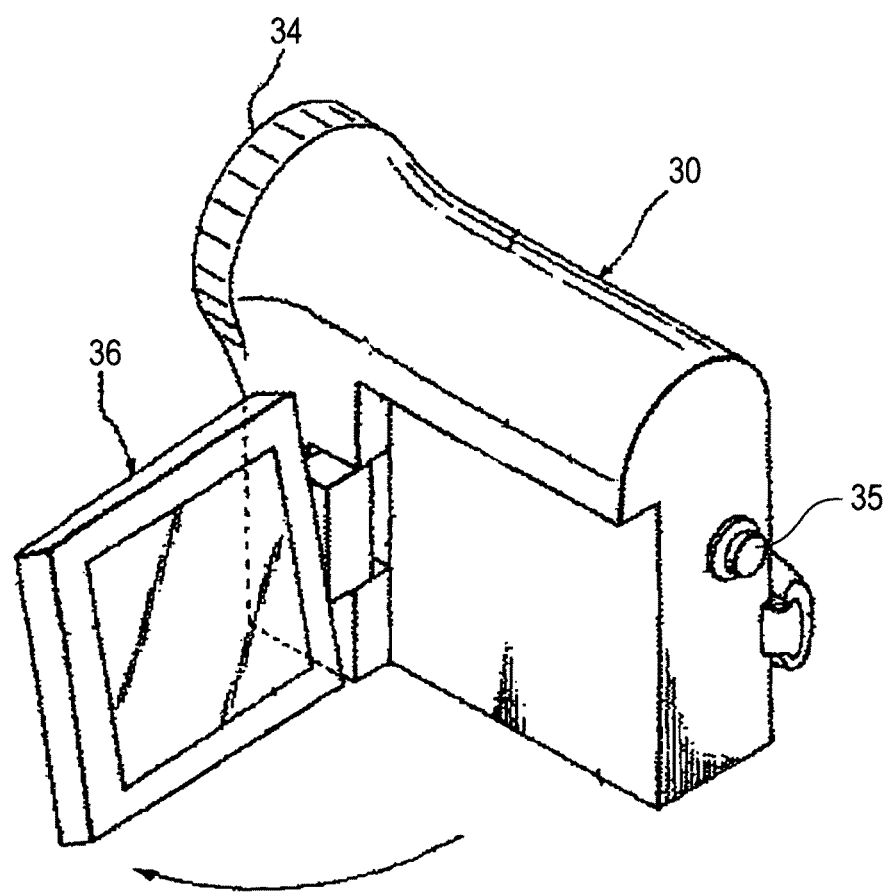
FIG. 24 is a perspective view showing a video camera including the display device according to the application example of the invention.

FIG. 24 shows a video camera to which the invention is applied, which includes a main body 30, a lens 34 for imaging subjects at a side surface facing the front, a start/stop switch 35 at the time of imaging, a monitor 36 and the like, which is fabricated by using the display device according to the embodiments of the invention as the monitor 36.

The present application contains subject matter related to that disclosed in Japanese Priority Patent Application JP 2008-286780 filed in the Japan Patent Office on Nov. 7, 2008, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A display device comprising:
   a screen unit;
   a drive unit; and
   a signal processing unit,
   wherein the screen unit includes rows of scanning lines, columns of signal lines, matrix-state pixel circuits and a light sensor,
   the drive unit includes a scanner supplying a control signal to the scanning lines and a driver supplying a video signal to the signal lines,
   the screen unit is sectioned into regions each having pixel circuits,
   the drive unit allows different pixel circuits belonging to different regions to simultaneously emit pixel light in accordance with the video signal,
   the light sensor detects the pixel light and outputs a luminance signal in accordance with the pixel light, and
   the signal processing unit corrects the video signal in accordance with the luminance signal and supplies a drive signal to the driver,
   wherein the signal processing unit compares a first luminance signal outputted from the light sensor during a first period with a second luminance signal outputted from the light sensor during a second period that is after the first period, corrects the video signal in accordance with a result of the comparison to generate a corrected video signal, and supplies the drive signal to the driver based on the corrected video signal.

2. The display device according to claim 1,
   wherein the light sensor is a set of light sensors arranged to correspond to different regions, and
   each light sensor outputs the first and the second luminance signals in accordance with pixel light emitted from pixel circuits corresponding to the region.

3. The display device according to claim 1,
   wherein the signal processing unit supplies the video signal for display during a display period in which a video is displayed in the screen unit, and supplies the video signal for detection during a detection period in which the video is not displayed in the screen unit.

4. The display device according to claim 3,
   wherein the signal processing unit supplies the video signal for detection in each frame and allows only pixel circuits of detection targets to emit pixel light.

5. An electronic product comprising:
a main body; and
a display displaying information inputted to the main body or information outputted from the main body,
wherein the display includes a screen unit, a drive unit and a signal processing unit,
the screen unit includes rows of scanning lines, columns of signal lines, matrix-state pixel circuits and a light sensor,
the drive unit includes a scanner supplying a control signal to the scanning lines and a driver supplying a video signal to the signal lines,
the screen unit is sectioned into regions each having pixel circuits,
the drive unit allows different pixel circuits belonging to different regions to simultaneously emit pixel light in accordance with the video signal,
the light sensor detects the pixel light and outputs a luminance signal in accordance with the pixel light and
the signal processing unit corrects the video signal in accordance with the luminance signal and supplies a drive signal to the driver,
wherein the signal processing unit compares a first luminance signal outputted from the light sensor during a first period with a second luminance signal outputted from the light sensor during a second period that is after the first period, corrects the video signal in accordance with a result of the comparison to generate a corrected video signal, and supplies the drive signal to the driver based on the corrected video signal.

6. The electronic product to claim 5,
wherein the light sensor is a set of light sensors arranged to correspond to different regions, and
each light sensor outputs the first and the second luminance signals in accordance with pixel light emitted from pixel circuits corresponding to the region.

7. The electronic product to claim 5,
wherein the signal processing unit supplies the video signal for display during a display period in which a video is displayed in the screen unit, and supplies the video signal for detection during a detection period in which the video is not displayed in the screen unit.

8. The electronic product to claim 7,
wherein the signal processing unit supplies the video signal for detection in each frame and allows only pixel circuits of detection targets to emit pixel light.

9. The display device according to claim 1, wherein the comparison of the first and second luminance signals produces a reduction amount, and
wherein the corrected video signal is configured to adjust the voltage of each pixel based on the reduction amount.

10. The electronic product to claim 5, wherein the comparison of the first and second luminance signals produces a reduction amount, and
wherein the corrected video signal is configured to adjust the voltage of each pixel based on the reduction amount.

* * * * *